(12) United States Patent
Lim et al.

(10) Patent No.: US 12,199,043 B2
(45) Date of Patent: Jan. 14, 2025

(54) SEMICONDUCTOR MEMORY DEVICES, METHODS FOR FABRICATING THE SAME AND ELECTRONIC SYSTEMS INCLUDING THE SAME

(71) Applicant: Samsung Electronics Co., Ltd., Suwon-si (KR)

(72) Inventors: Geun Won Lim, Yongin-si (KR); Beyoung Hyun Koh, Seoul (KR); Yong Jin Kwon, Yongin-si (KR); Joong Shik Shin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 611 days.

(21) Appl. No.: 17/412,408

(22) Filed: Aug. 26, 2021

(65) Prior Publication Data
US 2022/0189876 A1 Jun. 16, 2022

(30) Foreign Application Priority Data
Dec. 15, 2020 (KR) .......................... 10-2020-0174976

(51) Int. Cl.
*H01L 23/535* (2006.01)
*H01L 21/768* (2006.01)
(Continued)

(52) U.S. Cl.
CPC ...... *H01L 23/535* (2013.01); *H01L 21/76805* (2013.01); *H01L 21/76895* (2013.01);
(Continued)

(58) Field of Classification Search
CPC ............ H01L 23/535; H01L 21/76805; H01L 21/76895; H01L 21/76898;
(Continued)

(56) References Cited

U.S. PATENT DOCUMENTS 9,543,318 B1 * 1/2017 Lu .......................... H10B 43/27
10,685,975 B2 6/2020 Baek
(Continued)

FOREIGN PATENT DOCUMENTS

| CN | 109390343 A | 2/2019 |
|---|---|---|
| IN | 108878437 A | 11/2018 |
| KR | 101082290 B1 | 11/2011 |

*Primary Examiner* — Steven H Loke
*Assistant Examiner* — Anthony A Pulatov
(74) *Attorney, Agent, or Firm* — Myers Bigel, P.A.

(57) ABSTRACT

A semiconductor memory device may include a mold structure that includes mold insulation films and gate electrodes alternately stacked on a first substrate, a channel structure that penetrates the mold structure and intersects the gate electrodes, a block separation region that extends in a first direction parallel to an upper surface of the first substrate and cuts the mold structure, a first dam region and a second dam region spaced apart from each other, that each having a closed loop in a plan view and each cutting the mold structure, pad insulation films in the first and second dam regions that are alternately stacked with the mold insulation films and include a material different from the mold insulation films, and a through via which penetrates through the first substrate, the mold insulation films, and the pad insulation films, in the first dam region but not in the second dam region.

19 Claims, 25 Drawing Sheets

(51) Int. Cl.
    *H01L 27/11529* (2017.01)
    *H01L 27/11556* (2017.01)
    *H01L 27/11573* (2017.01)
    *H01L 27/11582* (2017.01)
    *H10B 41/27* (2023.01)
    *H10B 41/41* (2023.01)
    *H10B 43/27* (2023.01)
    *H10B 43/40* (2023.01)

(52) U.S. Cl.
    CPC ............ *H10B 41/27* (2023.02); *H10B 41/41* (2023.02); *H10B 43/27* (2023.02); *H10B 43/40* (2023.02)

(58) Field of Classification Search
    CPC ... H01L 2924/1437; H01L 2924/1436–14369; H01L 2924/1451; H01L 27/092–0928; H01L 28/40–92; H10B 41/20–27; H10B 43/00–50; H10B 20/40–50; H10B 53/00–50; H10B 51/00–50; H10B 63/84–845; H10B 10/00–18; H10B 12/00–50; H10B 69/00; H10B 41/00–70; G11C 11/41–419; G11C 11/401–4099; G11C 11/5621–5642; G11C 14/0009–0045; G11C 2211/4016; G11C 16/00–349; G11C 2216/06–10; G11C 2216/12–30

See application file for complete search history.

(56) References Cited

U.S. PATENT DOCUMENTS

| | | | |
|---|---|---|---|
| 10,896,918 B1* | 1/2021 | Oh | H01L 21/76877 |
| 2019/0214403 A1 | 7/2019 | Oike et al. | |
| 2019/0214404 A1 | 7/2019 | Ahn et al. | |
| 2019/0371812 A1 | 12/2019 | Oike | |
| 2020/0105783 A1 | 4/2020 | Baek | |
| 2020/0135749 A1 | 4/2020 | Hwang et al. | |
| 2021/0066313 A1* | 3/2021 | Park | H10B 43/40 |
| 2022/0102273 A1* | 3/2022 | Kubo | H01L 21/76816 |
| 2022/0157724 A1* | 5/2022 | Takii | H10B 43/27 |

* cited by examiner

SEMICONDUCTOR MEMORY DEVICES, METHODS FOR FABRICATING THE SAME AND ELECTRONIC SYSTEMS INCLUDING THE SAME

CROSS-REFERENCE TO RELATED APPLICATION

This application claims the benefit of priority under 35 U.S.C. § 119 from Korean Patent Application No. 10-2020-0174976 filed on Dec. 15, 2020, in the Korean Intellectual Property Office, with the contents of the above-identified application incorporated by reference herein in its entirety.

BACKGROUND

1. Technical Field

The present disclosure relates to semiconductor memory devices, methods for fabricating the same, and electronic systems including the semiconductor memory devices. More specifically, the present disclosure relates to semiconductor memory devices including a through via, methods for fabricating the same, and electronic systems including the semiconductor memory devices.

2. Description of the Related Art

In order to satisfy performance characteristics and low prices desired by consumers, there has been interest in increasing the degree of integration of semiconductor memory devices. This is in part because a degree of integration is an important factor in determining the price of the product, and as such increased density is particularly desirable.

For two-dimensional or planar semiconductor memory devices, the degree of integration is mainly determined by an area occupied by a unit memory cell, and is therefore greatly affected by the level of fine pattern forming technology. However, since the apparatuses required for miniaturization of patterns can be very expensive, the degree of integration of two-dimensional semiconductor memory devices is increasing, but is limited by cost and manufacturing factors. As a result, three-dimensional semiconductor memory devices including memory cells placed three-dimensionally have been proposed.

SUMMARY

Aspects of the present disclosure provide semiconductor memory devices in which product reliability is improved.

Aspects of the present disclosure also provide methods for fabricating semiconductor memory devices in which product reliability is improved.

Aspects of the present disclosure also provide electronic systems in which product reliability is improved.

According to some aspects of the present disclosure, there is provided a semiconductor memory device comprising a mold structure that includes mold insulation films and gate electrodes alternately stacked on a first substrate, a channel structure that penetrates through the mold structures and intersects the gate electrodes, a block separation region that extends in a first direction parallel to an upper surface of the first substrate and that cuts the mold structure, a first dam region that has a closed loop in a plane parallel to the upper surface of the first substrate and that cuts the mold structure, a second dam region that is spaced apart from the first dam region in the first direction, that has a closed loop in the plane parallel to the upper surface of the first substrate, and cuts the mold structure, pad insulation films in the first dam region and the second dam region that are alternately stacked with the mold insulation films and that include a material different from the mold insulation films, and a through via in the first dam region that penetrates through the first substrate, the mold insulation films, and the pad insulation films, wherein the through via is placed in the first dam region and is not placed in the second dam region.

According to some aspects of the present disclosure, there is provided a semiconductor memory device comprising a first substrate that includes a cell array region and an extension region arranged along a first direction, a mold structure including a mold insulation films and gate electrodes alternately stacked on an upper surface of the first substrate, a channel structure in the cell array region that penetrates through the mold structure and intersects the gate electrode, a first dam region in the extension region that has a closed loop in a plane parallel to the upper surface of the first substrate in the extension region, and that cuts the mold structure, a second dam region in the extension region that is spaced part from the first dam region in the first direction, that has a closed loop in the plane parallel to the upper surface of the first substrate, and that cuts the mold structure, pad insulation films in the first dam region and the second dam region that are alternately stacked with the mold insulation film and that include a material different from the mold insulation films, a second substrate including an upper surface that faces a lower surface of the first substrate, a peripheral circuit element on the upper surface of the second substrate, and a first through via in the first dam region that penetrates through the first substrate, the mold insulation films, and the pad insulation films, and connects a gate electrode of the gate electrodes with the peripheral circuit element.

According to some aspects of the present disclosure, there is provided a method for fabricating a semiconductor memory device, the method comprising forming a preliminary mold structure including mold insulation films and sacrificial films alternately stacked on a first substrate, forming a channel structure that penetrates the preliminary mold structure and intersects the sacrificial film, forming a block separation region that extends in a first direction parallel to an upper surface of the first substrate and cuts the preliminary mold structure, forming a first dam region that has a closed loop on a plane parallel to an upper surface of the first substrate, and that cuts the preliminary mold structure, forming a second dam region that is spaced apart from the first dam region in the first direction, that has a closed loop in the plane parallel to the upper surface of the first substrate, and that cuts the preliminary mold structure, replacing the sacrificial film outside the first dam region and the second dam region with a gate electrode, using the block separation region, and forming a through via in the first dam region that penetrates through the first substrate, the mold insulation films, and the sacrificial films.

According to another aspect of the present disclosure, there is provided an electronic system comprising a main board, a semiconductor memory device on the main board, and a controller electrically connected to the semiconductor memory device, on the main board, wherein the semiconductor memory device includes a mold structure that includes a mold insulation film and a gate electrode alternately stacked on a first substrate, a channel structure that penetrates the mold structure and that intersects the gate electrode, a block separation region that extends in a first direction parallel to an upper surface of the first substrate and cuts the mold structure, a first dam region that forms a closed loop in a plane parallel to the upper surface of the first substrate and cuts the mold structure, a second dam region that is spaced apart from the first dam region in the first direction, that forms a closed loop in the plane parallel to the upper surface of the first substrate, and that cuts the mold structure, pad insulation films in the first dam region and the second dam region that are alternately stacked with the mold insulation films and that include a material different from the mold insulation films, a decoder circuit connected to the controller, and a through via in the first dam region that penetrates through the first substrate, the mold insulation films, and the pad insulation films to connect the gate electrode of the gate electrodes with the decoder circuit, in the first dam region.

According to some aspect of the present disclosure, there is provided a semiconductor memory device comprising: a first substrate; a mold structure that includes a plurality of alternately stacked mold insulation films and gate electrodes; a channel structure that penetrates the mold structure and that intersects the gate electrodes; first and second block separation regions that extend in a first direction parallel to an upper surface of the first substrate and that cut the mold structure; first and second dam regions between the first and second block separation regions and spaced apart from each other, the first and second dam regions each cutting the mold structure and each having a closed loop when viewed in a plan view; pad insulation films in the first dam region and the second dam region, the pad insulation films alternately stacked with the mold insulation films and including a material different from the mold insulation films; and a through via in the first dam region that penetrates through the first substrate, the mold insulation films, and the pad insulation films. The second dam region may have a smaller perimeter in the plan view than the first dam region.

However, aspects of the present disclosure are not restricted to the those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof referring to the attached drawings, in which.

DETAILED DESCRIPTION OF THE EMBODIMENTS

Hereinafter, a semiconductor memory device according to exemplary embodiments will be explained referring to FIGS. 1 to 12.

Figure 1:
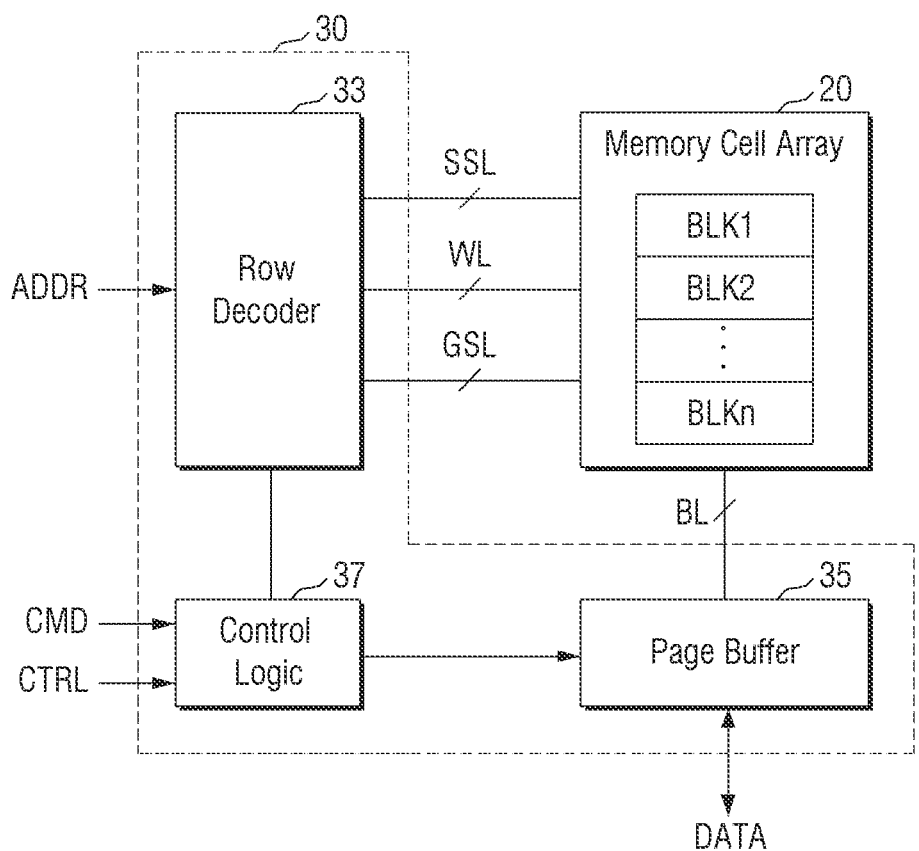
FIG. 1 is an exemplary block diagram for explaining a semiconductor memory device according to some embodiments.

FIG. 1 is an exemplary block diagram for explaining a semiconductor memory device according to some embodiments.

Referring to FIG. 1, a semiconductor memory device 10 according to some embodiments may include a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell blocks BLK1 to BLKn may be connected to the peripheral circuit 30 through at least one bit line BL, at least one word line WL, at least one string selection line SSL, and at least one ground selection line GSL.

Specifically, the memory cell blocks BLK1 to BLKn may be connected to a row decoder 33 through the at least one word line WL, at least one string selection line SSL, and at least one ground selection line GSL. Further, the memory cell blocks BLK1 to BLKn may be connected to a page buffer 35 through the at least one bit line BL.

The peripheral circuit 30 may receive an address ADDR, a command CMD and a control signal CTRL from a source (not shown) external to the semiconductor memory device 10, and may transmit and receive data DATA to and from a device outside the semiconductor memory device 10. The peripheral circuit 30 may include a control logic 37, a row decoder 33, and a page buffer 35.

Although not shown in FIG. 1, the peripheral circuit 30 may further include various sub-circuits, such as an I/O circuit, a voltage generation circuit configured to generate various voltages used in the operation of the semiconductor memory device 10, and an error correction circuit configured to correct an error of the data DATA that is read from the memory cell array 20.

The control logic 37 may be connected to the row decoder 33, the I/O circuit, and the voltage generation circuit. The control logic 37 may control the overall operation of the semiconductor memory device 10. The control logic 37 may generate various internal control signals used inside the semiconductor memory device 10 in response to a control signal CTRL. For example, the control logic 37 may adjust the voltage levels provided to the word line WL and the bit line BL when performing memory operations such as a program operation or an erase operation.

The row decoder 33 may select at least one of a plurality of memory cell blocks BLK1 to BLKn in response to the address ADDR, and may select at least one word line WL, at least one string selection line SSL, and at least one ground selection line GSL of the selected memory cell blocks BLK1 to BLKn. The row decoder 33 may transfer a voltage for performing a memory operation to the word lines WL of the selected memory cell blocks BLK1 to BLKn.

The page buffer 35 may be connected to the memory cell array 20 through the at least one bit line BL. The page buffer 35 may operate as a writer driver or a sense amplifier. Specifically, at the time of program operation, the page buffer 35 may operate as a write driver to apply to at least one bit line BL a voltage corresponding to the data DATA to be stored in the memory cell array 20. At the time of the read operation, the page buffer 35 may operate as a sense amplifier to sense the data DATA stored in the memory cell array 20.

Figure 2:
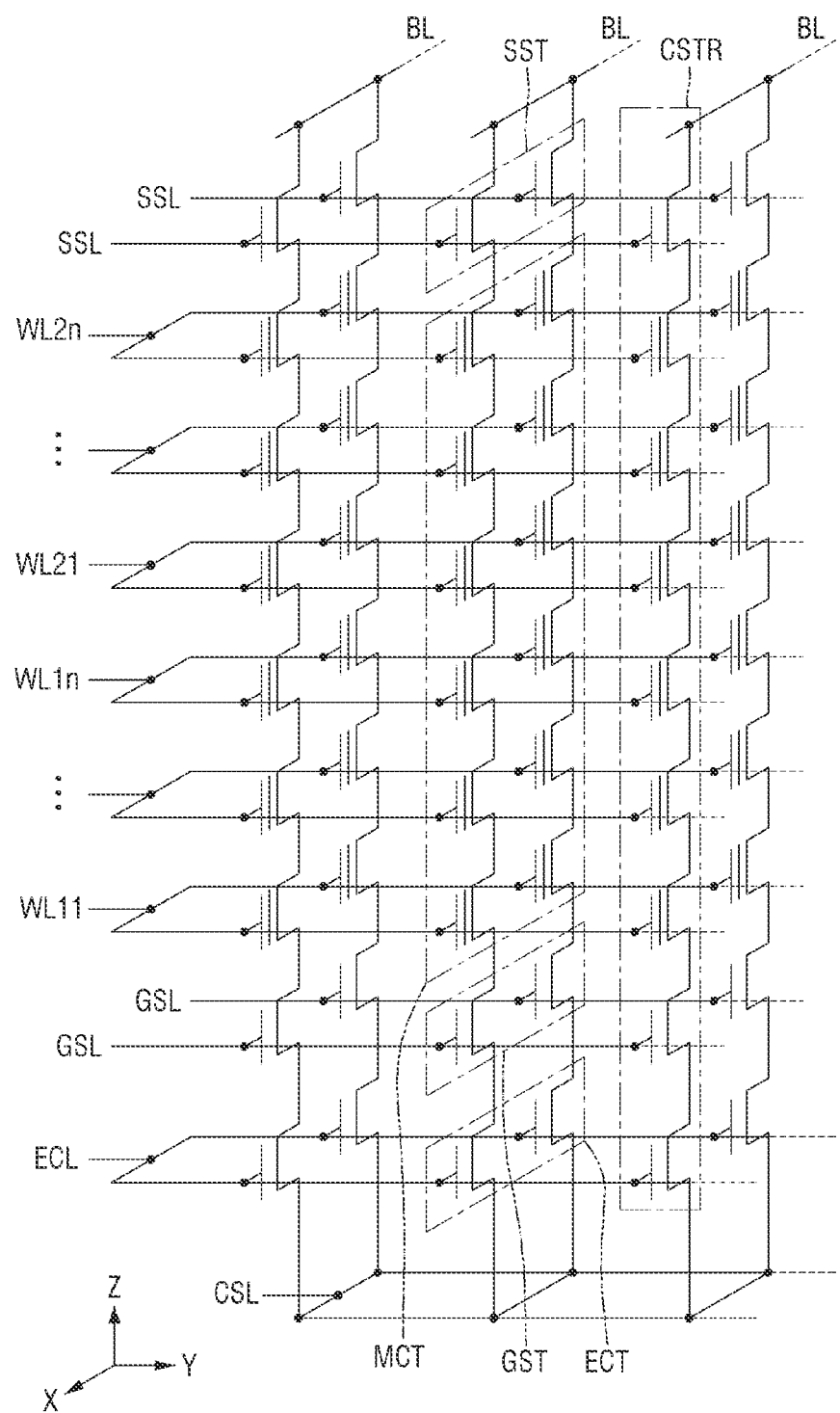
FIG. 2 is an exemplary circuit diagram for explaining the semiconductor memory device according to some embodiments.

FIG. 2 is an exemplary circuit diagram for explaining the semiconductor memory device according to some embodiments.

Referring to FIG. 2, the memory cell array (e.g., 20 of FIG. 1) of the non-volatile memory device according to some embodiments may include a common source line CSL, a plurality of bit lines BL, and a plurality of cell strings CSTR.

The common source line CSL may extend in a first direction Y. In some embodiments, a plurality of common source lines CSL may be arranged two-dimensionally. For example, the plurality of common source lines CSL may be spaced apart from each other and each extend in the first direction Y. Electrically equal voltages may be applied to the common source lines CSL, or different voltages are applied thereto, and/or the common source lines CSL may be controlled separately.

The plurality of bit lines BL may be arranged two-dimensionally. For example, the bit lines BL may be spaced apart from each other and each extend in a second direction X that intersects the first direction Y. One or more of the plurality of cell strings CSTR may be connected in parallel to each bit line BL. The cell strings CSTR may be connected in common to the common source line CSL. That is, the plurality of cell strings CSTR may be placed between the bit lines BL and the common source line CSL.

Each cell string CSTR may include a ground selection transistor GST connected to the common source line CSL, a string selection transistor SST connected to the bit line BL, and a plurality of memory cell transistors MCT placed between the ground selection transistor GST and the string selection transistor SST. Each memory cell transistor MCT may include a data storage element. The ground selection transistor GST, the string selection transistor SST, and the memory cell transistors MCT may be connected in series.

The common source line CSL may be commonly connected to the sources of the ground selection transistor GST. Also, a ground selection line GSL, a plurality of word lines WL11 to WL1n, WL21 to WL2n, and a string selection line SSL may be placed between the common source line CSL and the bit line BL. The ground selection line GSL may be used as a gate electrode of the ground selection transistor GST, the word lines WL11 to WL1n, WL21 to WL2n may be used as the gate electrodes of the memory cell transistors MCT, and the string selection line SSL may be used as the gate electrode of the string selection transistor SST.

In some embodiments, and as seen in FIG. 2, an erasure control transistor ECT may be placed between the common source line CSL and the ground selection transistor GST. The common source line CSL may be commonly connected to the sources of the erasure control transistor ECT. Further, an erasure control line ECL may be placed between the common source line CSL and the ground selection line GSL. The erasure control line ECL may be used as a gate electrode of the erasure control transistor ECT. The erasure control transistors ECT may generate a gate induced drain leakage (GIDL) to perform the erasure operation of the memory cell array.

Figure 3:
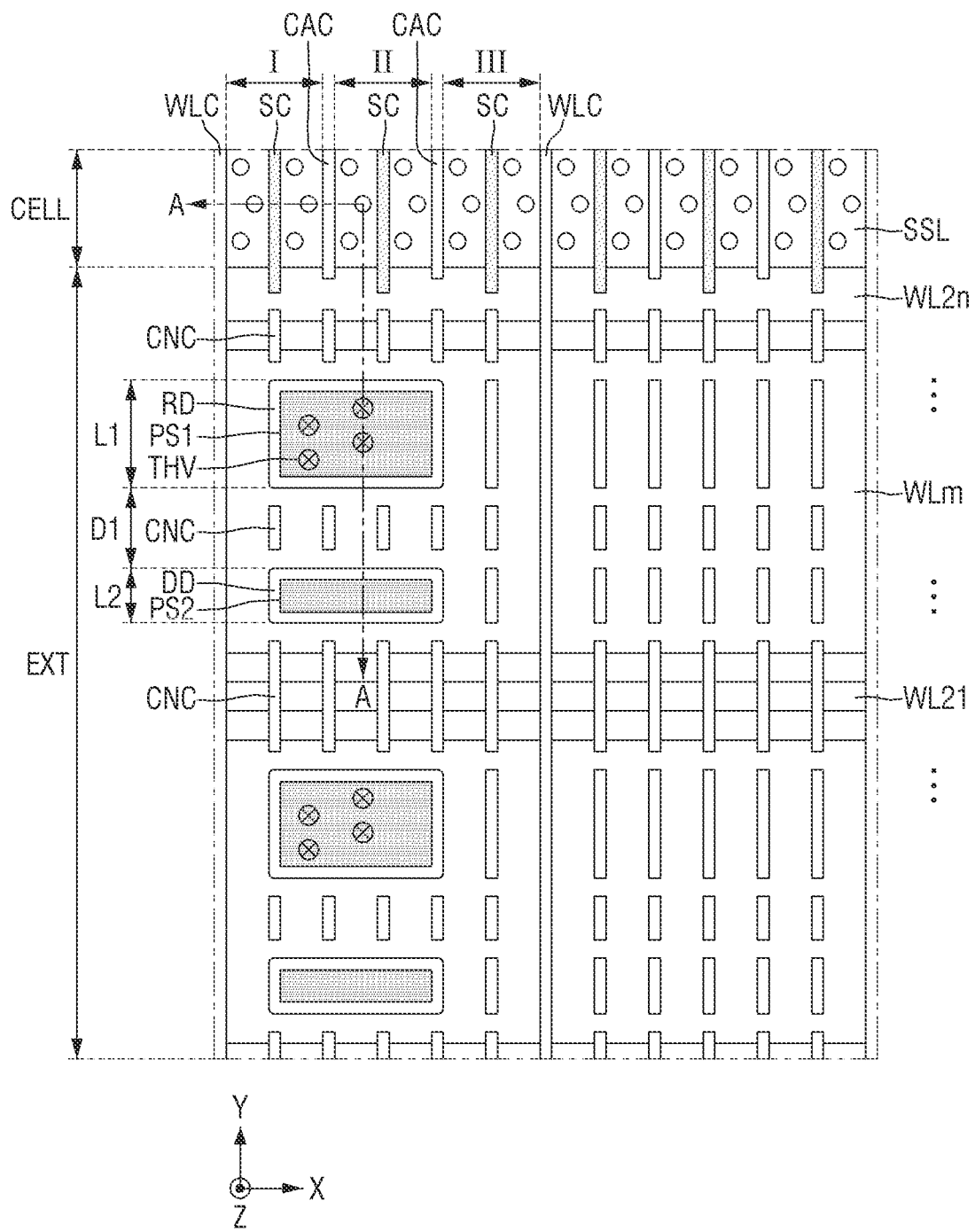
FIG. 3 is a layout diagram for explaining a semiconductor memory device according to some embodiments.
Figure 4:
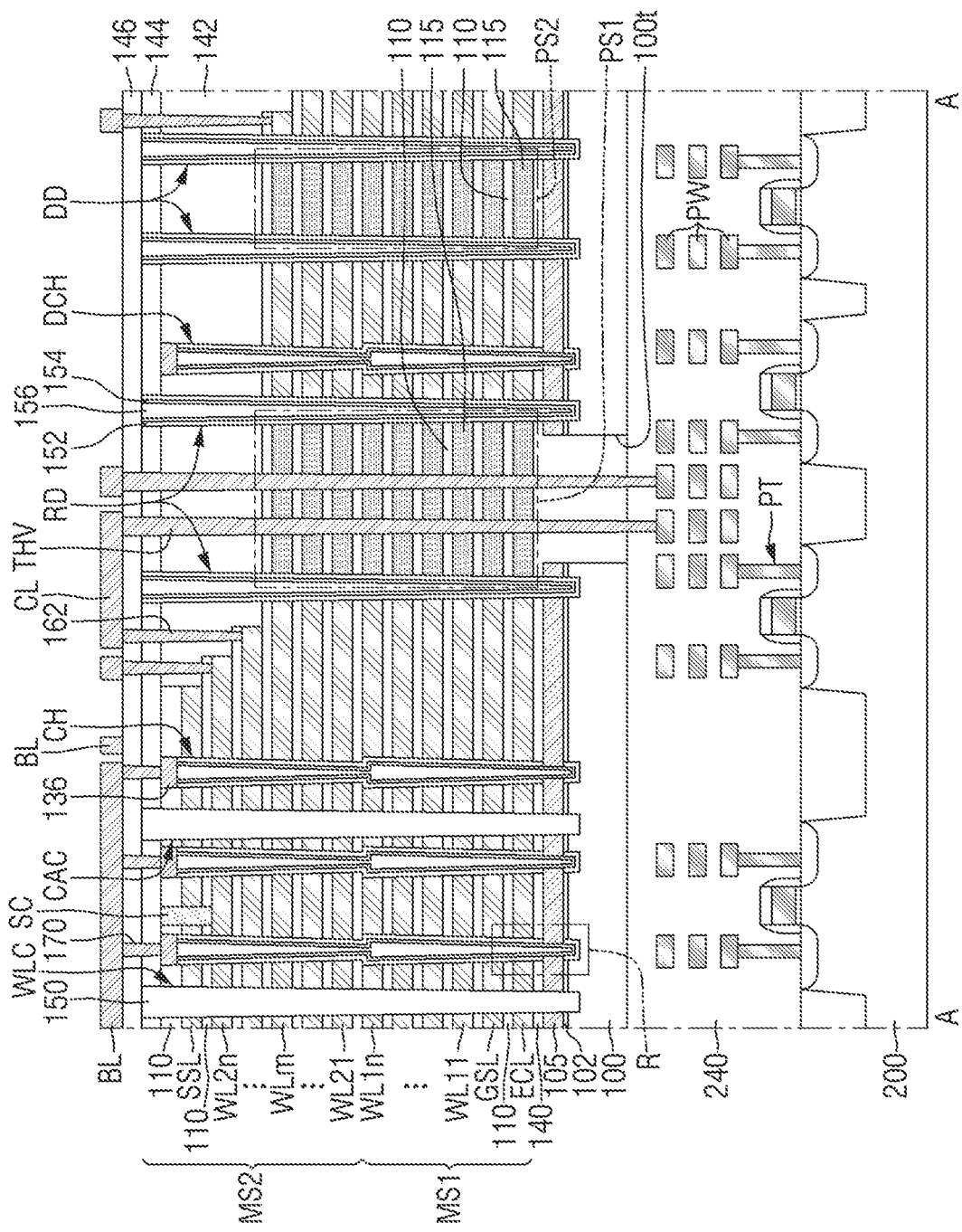
FIG. 4 is a cross-sectional view taken along A-A of FIG. 3.
Figure 5:
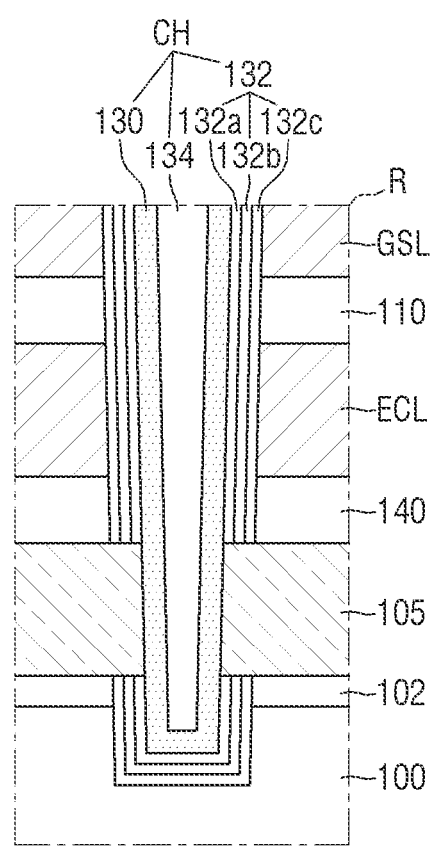
FIG. 5 is an extension view for explaining a region R of FIG. 4.

FIG. 3 is a layout diagram for explaining a semiconductor memory device according to some embodiments. FIG. 4 is a cross-sectional view taken along A-A of FIG. 3. FIG. 5 is an extension view for explaining a region R of FIG. 4.

Referring to FIGS. 1 to 5, the semiconductor memory device according to some embodiments includes a first substrate 100, mold structures MS1 and MS2, a channel structure CH, a bit line BL, a block separation region WLC, a cell gate cutting region CAC, an extension gate cutting region CNC, a first dam region RD, a second dam region DD, a first pad structure PS1, a second pad structure PS2, a second substrate 200, a peripheral circuit element PT, and a first through via THV.

The first substrate 100 may include, as non-limiting examples, a semiconductor substrate, such as a silicon substrate, a germanium substrate, or a silicon-germanium substrate. Alternatively, the first substrate 100 may include a silicon-on-insulator (SOI) substrate, a germanium-on-insulator (GOI) substrate, or the like. In some embodiments, the first substrate 100 may include impurities. For example, the first substrate 100 may include n-type impurities (e.g., phosphorus (P), arsenic (As), etc.).

The first substrate 100 may include a cell array region CELL and an extension region EXT. The cell array region CELL and the extension region EXT may be cut by a plurality of block separation regions WLC to form a plurality of memory cell blocks (for example, BLK1 to BLKn of FIG. 1). For example, the block separation region WLC may extend in the first direction Y parallel to an upper surface of the first substrate 100 to cut the cell array region CELL and the extension region EXT.

A memory cell array (e.g., 20 of FIG. 1) including a plurality of memory cells may be formed in the cell array region CELL. For example, a channel structure CH, a bit line BL, gate electrodes ECL, GSL, WL11 to WL1n, WL21 to WL2n, and SSL, and the like, may be placed in the cell array region CELL, as explained herein.

The extension region EXT may be placed around the cell array region CELL. The gate electrodes ECL, GSL, WL11 to WL1n, WL21 to WL2n, and SSL, as explained herein, may be stacked in the extension region EXT in a stepped manner. In some embodiments, the cell array region CELL and the extension region EXT may be arranged in a direction along which the block separation region WLC extends. For example, the cell array region CELL and the extension region EXT may be arranged along the first direction Y.

The mold structures MS1 and MS2 may be formed on the first substrate 100. For example, a first interlayer insulation film 140 that covers the first substrate 100 may be formed on the first substrate 100. The mold structures MS1 and MS2 may be stacked on an upper surface of the first interlayer insulation film 140.

The mold structures MS1 and MS2 may include a plurality of gate electrodes ECL, GSL, WL11 to WL1n, WL21 to WL2n, and SSL and a plurality of mold insulation films 110 that are alternately stacked on the first substrate 100. In some embodiments, the mold structures MS1 and MS2 may include a first mold structure MS1 and a second mold structure MS2 that are sequentially stacked on the first substrate 100.

The first mold structure MS1 may be formed on the first substrate 100. The first mold structure MS1 may include a plurality of first gate electrodes ECL, GSL, and WL11 to WL1n and a plurality of mold insulation films 110 that are alternately stacked on the first substrate 100. For example, the first gate electrodes ECL, GSL, and WL11 to WL1n and the mold insulation films 110 may each have a layered structure that extends in parallel to the upper surface of the first substrate 100. The first gate electrodes ECL, GSL, and WL11 to WL1n and the mold insulation films 110 may be stacked alternately along a third direction Z that intersects (e.g., is perpendicular to) the upper surface of the first substrate 100. Adjacent gate electrodes in the third direction Z may be separated by one of the plurality of mold insulation films 110.

In some embodiments, the first gate electrodes ECL, GSL, and WL11 to WL1n may include an erasure control line ECL, a ground selection line GSL, and a plurality of first word lines WL11 to WL1n that are sequentially stacked on the first substrate 100. In some embodiments, the erasure control line ECL may be omitted.

The second mold structure MS2 may be formed on the first mold structure MS1. The second mold structure MS2 may include a plurality of second gate electrodes WL21 to WL2n, and SSL and a plurality of mold insulation films 110 that are alternately stacked on the first mold structure MS1. For example, the second gate electrodes WL21 to WL2n, and SSL and the mold insulation films 110 may have a layered structure that extends in parallel to the upper surface of the first substrate 100. The second gate electrodes WL21 to WL2n, and SSL and the mold insulation films 110 may be alternately stacked along the third direction Z.

In some embodiments, the second gate electrodes WL21 to WL2n, and SSL may include a plurality of second word lines WL21 to WL2n and a string selection line SSL that are sequentially stacked on the first mold structure MS1.

The first gate electrodes ECL, GSL, and WL11 to WL1n, as well as the second gate electrodes WL21 to WL2n and SSL may include a conductive material. For example, the first gate electrodes ECL, GSL, and WL11 to WL1n and the second gate electrodes WL21 to WL2n, and SSL may each include, as non-limiting examples, a metal such as tungsten (W), cobalt (Co), and nickel (Ni), or a semiconductor material, such as silicon.

The mold insulation films 110 may include an insulating material. As one non-limiting example, the mold insulation films 110 may include a silicon oxide film.

In some embodiments, a second interlayer insulation film 142 may be formed on the first substrate 100. The second interlayer insulation film 142 may cover the mold structures MS1 and MS2. The second interlayer insulation film 142 may include, as non-limiting examples, at least one of silicon oxide, silicon oxynitride, and/or a low dielectric constant (low-k) material having a lower dielectric constant than silicon oxide.

The channel structure CH may penetrate the mold structures MS1 and MS2. The channel structure CH may intersect a plurality of gate electrodes ECL, GSL, WL11 to WL1n, WL21 to WL2n, and SSL. For example, the channel structure CH may have a pillar shape (e.g., a columnar shape) that extends in the third direction Z.

Although the channel structure CH is only shown as being formed inside the mold structures MS1 and MS2 of the cell array region CELL, this is only for convenience of explanation. For example, as seen in FIG. 4, in order to reduce a stress applied to the mold structures MS1 and MS2, a dummy channel structure DCH having a shape similar to that of the channel structure CH may be formed inside the mold structures MS1 and MS2 of the extension region EXT. The dummy channel structure DCH may penetrate through the second interlayer insulation film 142 and the mold structures MS1 and MS2. As seen in FIG. 5, the channel structure CH and/or the dummy channel structure DCH may include a semiconductor pattern 130 and an information storage film 132.

The semiconductor pattern 130 may extend in the third direction Z to penetrate through the mold structures MS1 and MS2 and the layers of the mold structures MS1 and MS2. The semiconductor pattern 130 may have a cup shape where one end (e.g., the end more proximate to the substrate 100) is closed. Although the semiconductor pattern 130 is shown as a cup shape, this is only an example. For example, the semiconductor pattern 130 may have various shapes such as a cylindrical shape, a rectangular barrel shape, and a solid pillar shape.

The semiconductor pattern 130 may include, as non-limiting examples, semiconductor materials, such as, for example, single crystal silicon, polycrystalline silicon, organic semiconductor matter and/or carbon nanostructures.

The information storage film 132 may be interposed between the semiconductor pattern 130 and the respective gate electrodes ECL, GSL, WL11 to WL1n, WL21 to WL2n, and SSL. For example, the information storage film 132 may extend along the side surfaces of the semiconductor pattern 130.

The information storage film 132 may include, as non-limiting examples, at least one of silicon oxide, silicon nitride, silicon oxynitride, and/or a high dielectric constant material having a higher dielectric constant than that of silicon oxide. The high dielectric constant material may include, as non-limiting examples, at least one of aluminum oxide, hafnium oxide, lanthanum oxide, tantalum oxide, titanium oxide, lanthanum hafnium oxide, lanthanum aluminum oxide, dysprosium scandium oxide, or a combination of these materials.

In some embodiments, the information storage film 132 may be formed by multi-films or a plurality of films. For example, as shown in FIG. 5, the information storage film 132 may include a tunnel insulation film 132a, a charge storage film 132b, and a blocking insulation film 132c, which are sequentially stacked on the semiconductor pattern 130.

The tunnel insulation film 132a may include, as non-limiting examples, a silicon oxide or a high dielectric constant material (e.g., aluminum oxide ($Al_2O_3$), and hafnium oxide ($HfO_2$)) having a higher dielectric constant than that of silicon oxide. The charge storage film 132b may include, for example, silicon nitride. The blocking insulation film 132c may include, for example, a silicon oxide or a high dielectric constant material having a higher dielectric constant than that of silicon oxide (e.g., aluminum oxide ($Al_2O_3$), and hafnium oxide ($HfO_2$)).

In some embodiments, the channel structure CH may further include a filling pattern 134. The filling pattern 134 may be formed to fill the inside of the semiconductor pattern 130 (e.g., the cup-shaped semiconductor pattern 130). The filling pattern 134 may include, as a non-limiting example, an insulating material such as silicon oxide.

As seen in FIG. 4 some embodiments, the channel structure CH may further include a channel pad 136. The channel pad 136 may be formed to be connected to the upper part of the semiconductor pattern 130. The channel pad 136 may include, as one non-limiting example, impurity-doped polysilicon.

In some embodiments, a plurality of channel structures CH may be arranged in a zigzag form. For example, as shown in FIG. 3, a plurality of channel structures CH may be arranged to be offset from each other in the second direction X and the first direction Y. The plurality of channel structures CH arranged in the zigzag form may further improve the degree of integration of the semiconductor memory device.

In some embodiments, a source structure 105 may be formed on the first substrate 100. The source structure 105 may be interposed between the first substrate 100 and the mold structures MS1 and MS2. The source structure 105 may include, for example, impurity-doped polysilicon or metal.

The source structure 105 may be formed to be connected to the semiconductor pattern 130 of the channel structure CH. For example, as seen in FIG. 5, the source structure 105 may penetrate the information storage film 132, and the source structure 105 may be in contact with the semiconductor pattern 130. In some embodiments, the channel structure CH may penetrate the source structure 105. For example, the lower part of the channel structure CH may penetrate the source structure 105 and may be buried inside the first substrate 100.

In some embodiments, a base insulation film 102 may be formed on the first substrate 100. The base insulation film 102 may be interposed between the first substrate 100 and the source structure 105. The base insulation film 102 may include, as non-limiting examples, at least one of silicon oxide, silicon oxynitride and/or a low dielectric constant (low-k) material having a lower dielectric constant than that of silicon oxide.

The bit line BL may be formed on the mold structures MS1 and MS2. For example, the bit line BL may be formed on the second to fourth interlayer insulation films 142, 144, and 146, which are sequentially stacked on the mold structures MS1 and MS2.

The bit line BL may extend in the second direction X parallel to the upper surface of the first substrate 100 and may be connected to a plurality of channel structures CH. For example, a bit line contact 170 that penetrates the third and fourth interlayer insulation films 144 and 146 and is connected to each channel structure CH may be formed. The bit line BL may be electrically connected to a plurality of channel structures CH through the bit line contact 170.

The block separation region WLC is formed in the cell array region CELL and the extension region EXT and may cut the gate electrodes ECL, GSL, WL11 to WL1n, WL21 to WL2n, and SSL. Also, the block separation region WLC may intersect the bit line BL. For example, a plurality of block separation regions WLC may be arranged in the cell array region CELL and the extension region EXT along the second direction X. Each block separation region WLC may extend in the first direction Y to cut the mold structures MS1 and MS2.

As explained above, the block separation region WLC may cut the cell array region CELL and the extension region EXT to form a plurality of memory cell blocks BLK1 to BLKn. For example, each block separation region WLC may extend in length in the first direction Y and may completely cut the mold structures MS1 and MS2. The mold structures MS1 and MS2 that are cut by two adjacent block separation regions WLC may define one of the block regions BLK1 to BLKn.

The cell gate cutting region CAC may be formed in the cell array region CELL and may cut the gate electrodes ECL, GSL, WL11 to WL1n, WL21 to WL2n, and SSL, and the mold insulation films 110. Also, the cell gate cutting region CAC may intersect the bit line BL. For example, the plurality of cell gate cutting regions CAC may be in the cell array region CELL and spaced apart from each other in the second direction X. Each cell gate cutting region CAC may extend in the first direction Y to cut the mold structures MS1 and MS2 inside the cell array region CELL.

The cell gate cutting region CAC may form a plurality of sections I, II, and III inside one of the block regions BLK1 to BLKn of the cell array region CELL. For example, as shown in FIG. 3, two cell gate cutting regions CAC may be formed between two adjacent block separation regions WLC. As a result, three sections (hereinafter, first to third sections I, II, and III) may be formed between the two adjacent block separation regions WLC. The cell gate cutting regions CAC allow the first section I and the second section II to be separated and controlled separately, and the second section II and the third section III to be separated and controlled separately.

The extension gate cutting region CNC may be formed in the extension region EXT to cut the gate electrodes ECL, GSL, WL11 to WL1n, WL21 to WL2n, and SSL. Also, the extension gate cutting region CNC may intersect the bit line BL. A plurality of extension gate cutting regions CNC may be in the extension region EXT and spaced apart from each other in the second direction X. Each extension gate cutting region CNC may extend in the first direction Y to cut the mold structures MS1 and MS2 in the extension region EXT.

In some embodiments, at least a part of the extension gate cutting region CNC may be arranged to overlap the cell gate cutting region CAC in the first direction Y. For example, as shown in FIG. 3, five extension gate cutting regions CNC may be formed between two adjacent block separation regions WLC. As an example, two of the five extension gate cutting regions CNC may overlap the two cell gate cutting regions CAC in the first direction Y.

The block separation region WLC, the cell gate cutting region CAC, and the extension gate cutting region CNC may each include a first material pattern 150. The first material pattern 150 may be formed to fill the block separation region WLC, the cell gate cutting region CAC, and the extension gate cutting region CNC. The first material pattern 150 may include, as non-limiting examples, at least one of polysilicon, silicon oxide, silicon nitride, silicon oxynitride and/or a low dielectric constant (low-k) material having a lower dielectric constant than that of silicon oxide.

In some embodiments, the block separation region WLC, the cell gate cutting region CAC, and the extension gate cutting region CNC may be formed at the same level. As used herein, the expression "formed at the same level" may mean that the regions are formed by the same fabricating process. In some embodiments, the insulating materials that form the block separation region WLC, the cell gate cutting region CAC and the extension gate cutting region CNC may be identical to each other.

In some embodiments, a string separation structure SC may be formed inside the mold structures MS1 and MS2 of the cell array region CELL. The string separation structure SC may be interposed between two adjacent block separation regions WLC to cut the string selection line SSL of the mold structures MS1 and MS2. A plurality of string separation structures SC may be arranged in the cell array region CELL along the second direction X. Each string separation structure SC may extend in the first direction Y to cut the string selection line SSL.

In some embodiments, the string separation structure SC may be interposed between the block separation region WLC and the cell gate cutting region CAC. For example, the string separation structure SC may be placed in each of the first to third sections I, II, and III. Accordingly, the first to third sections I, II, and III may provide two string selection lines SSL that are each electrically separated and controlled separately. As an example, six string selection lines SSL may be formed between two adjacent block separation regions WLC.

In some embodiments, at least a part of the extension gate cutting region CNC may be arranged to overlap the string separation structure SC in the first direction Y. For example, as shown in FIG. 3, five extension gate cutting regions CNC may be formed between two adjacent block separation regions WLC. As an example, three of the five extension gate cutting regions CNC may overlap the three string separation structures SC in the first direction Y.

A first dam region RD and a second dam region DD may be formed in the mold structures MS1 and MS2. The first dam region RD and the second dam region DD may each form a closed loop in a plane parallel to the upper surface of the first substrate 100 (for example, a plane extending in the first direction Y and the second direction X). For example, as shown in FIG. 3, the first dam region RD and the second dam region DD may each form a rectangular closed loop, when viewed in a plan view. The first dam region RD and the second dam region DD may cut the mold structures MS1 and MS2. For example, as shown in FIG. 4, the first dam region RD and the second dam region DD may each extend in the third direction Z and penetrate the mold structures MS1 and MS2.

In some embodiments, the first dam region RD and the second dam region DD may be formed inside the mold structures MS1 and MS2 of the extension region EXT. For example, the mold structures MS1 and MS2 may include a first pad gate electrode WLm stacked in a stepped manner in the extension region EXT. In the extension region EXT, at least a part of the first pad gate electrode WLm may be exposed from the gate electrodes (e.g., WL2n, SSL) stacked on the top thereof. The first dam region RD and the second dam region DD may be formed in the exposed region of the first pad gate electrode WLm.

However, the technical idea of the present disclosure is not limited thereto, and the first dam region RD and/or the second dam region DD may, of course, be formed inside the mold structures MS1, MS2 of the cell array region CELL.

Although the first pad gate electrode WLm is only shown as being included in the second mold structure MS2, this is only an example, and the first pad gate electrode WLm may be included in the mold structure MS1.

The second dam region DD may be separated from the first dam region RD. In some embodiments, the second dam region DD may be separated from the first dam region RD in the first direction Y. A spaced distance D1 between the first dam region RD and the second dam region DD may be, for example, about 2 µm to about 5 µm. As an example, the spaced distance D1 between the first dam region RD and the second dam region DD may be about 3 µm to about 4 µm.

In some embodiments, one or more extension gate cutting regions CNC may be interposed between the first dam region RD and the second dam region DD. The one or more extension gate cutting regions CNC may be arranged in one or more rows. Although FIG. 3 shows that only one row of extension gate cutting regions CNC arranged along the second direction X are interposed between the first dam region RD and the second dam region DD, this is only an example. In some embodiments, no extension gate cutting regions CNC are interposed between the first dam region RD and the second dam region DD.

In some embodiments, a part of the first dam region RD and/or a part of the second dam region DD may be arranged to overlap at least a part of the extension gate cutting regions CNC in the first direction Y. For example, as shown in FIG. 3, the first dam region RD and the second dam region DD forming a rectangular closed loop may include two sides each extending in the first direction Y. As an example, the two first sides may overlap the two extension gate cutting regions CNC in the first direction Y.

In some embodiments, the first dam region RD and the second dam region DD may each be formed to extend over a distance that a plurality of extension gate cutting regions CNC are spaced or arranged. For example, as shown in FIG. 3, the first dam region RD and the second dam region DD forming the rectangular closed loop may include two second sides each extending in the second direction X. As an example, the two second sides may be formed to extend a distance that the four extension gate cutting regions CNC are arranged along the second direction X.

Although the length of the first dam region RD in the second direction X and the length of the second dam region DD in the second direction X are shown as being the same, this is only an example. For example, the length of the first dam region RD in the second direction X may, be greater or smaller than the length of the second dam region DD in the second direction X.

In some embodiments, a first length L1 of the first dam region RD in the first direction Y may be greater than a second length L2 of the second dam region DD in the first direction Y. For example, the second length L2 may be about 0.1 to about 0.9 times the first length L1. As an example, the second length L2 may be about 0.3 to about 0.7 times the first length L1. In some embodiments, the first length L1 may be about 2 µm to about 5 µm. As an example, the first length L1 may be about 3 µm to about 4 µm. Accordingly, a perimeter (when viewed in a plan view) of the second dam region DD may be smaller than the perimeter of the first dam region RD.

In some embodiments, a dummy channel structure DCH may be interposed between the first dam region RD and the second dam region DD. Although FIG. 4 shows only one dummy channel structure DCH interposed between the first dam region RD and the second dam region DD, this is only an example. In some embodiments, no dummy channel structures DCH are interposed between the first dam region RD and the second dam region DD.

The first dam region RD and the second dam region DD may each include second material patterns 152, 154, and 156. The second material patterns 152, 154, and 156 may fill the first dam region RD and the second dam region DD. The second material patterns 152, 154, and 156 may include, as non-limiting examples, at least one of polysilicon, silicon oxide, silicon nitride, silicon oxynitride, and/or a low dielectric constant (low-k) material having a lower dielectric constant than that of silicon oxide.

In some embodiments, the second material patterns 152, 154, and 156 may be formed by multi-films or a plurality of films. For example, the second material patterns 152, 154, and 156 may include a first material film 152, a second material film 154, and a third material film 156 that are stacked sequentially. As an example, the first material film 152 may include a silicon oxide film, the second material film 154 may include a silicon nitride film, and the third material film 156 may include a polysilicon film.

The first pad structure PS1 may be formed in the first dam region RD. The first dam region RD may define the first pad structure PS1 in the mold structures MS1 and MS2. For example, the first dam region RD may surround the side surfaces of the first pad structure PS1.

The second pad structure PS2 may be formed in the second dam region DD. The second dam region DD may define a second pad structure PS2 in the mold structures MS1 and MS2. For example, the second dam region DD may surround the side surfaces of the second pad structure PS2.

The first pad structure PS1 and the second pad structure PS2 may each include a plurality of pad insulation films 115 and a plurality of mold insulation films 110 that are alternately stacked on the first substrate 100. For example, each pad insulation film 115 and each mold insulation film 110 may have a layered structure that extend in parallel to the upper surface of the first substrate 100. The pad insulation films 115 and the mold insulation films 110 may be alternately stacked along the third direction Z.

The pad insulation films 115 may be stacked at the same level as at least some of the gate electrodes ECL, GSL, WL11 to WL1n, WL21 to WL2n, and SSL. As used herein, the expression "stacked at the same level" may mean that the pad insulation films 115 are stacked at substantially the same height on the basis of the upper surface of the first substrate 100. For example, as shown in FIG. 4, the pad insulation films 115 may be stacked at the same level as the gate electrodes (for example, ECL, GSL, WL11 to WL1n, and WL21 to WLm) below the first pad gate electrode WLm. A first pad insulation film 115 may be stacked at the same level as a first gate electrode (e.g., gate electrode ECL), a second pad insulation film 115 may be stacked at the same level as a second gate electrode (e.g., gate electrode GSL), and so on.

In some embodiments, the height of the first pad structure PS1 may be the same as the height of the second pad structure PS2 from the upper surface of the first substrate 100. As used herein, the meaning of the term "same" indicates not only an exact equality, but also small or minute differences that may occur due to process margins and the like. The uppermost pad insulation film 115 of the first pad structure PS1 and the uppermost pad insulation film 115 of the second pad structure PS2 may be stacked at the same level as the first pad gate electrode WLm.

The pad insulation films 115 may include, as non-limiting examples, at least one of polysilicon, silicon oxide, silicon nitride, silicon oxynitride, and/or low dielectric constant (low-k) material having a lower dielectric constant than that of silicon oxide.

The pad insulation films 115 may include a material different from the mold insulation films 110. As an example, the mold insulation films 110 may include a silicon oxide film, and the pad insulation films 115 may include a silicon nitride film. Thus, the mold insulation films 110 and the pad insulation films 115 may have different etch selectivity from each other.

The pad insulation films 115 may also include a material different from the second material patterns 152, 154, and 156, or the films thereof. As an example, the first material film 152 may include a silicon oxide film, and the pad insulation films 115 may include a silicon nitride film. Thus, the first material film 152 and the pad insulation films 115 may have different etch selectivity from each other.

The second substrate 200 may be placed under the first substrate 100. For example, the upper surface of the second substrate 200 may face the lower surface of the first substrate 100. The first substrate 100 may be formed on the second substrate 200. A fifth interlayer insulation film 240 that covers the second substrate 200 may be formed on the second substrate 200. The first substrate 100 may be stacked on the upper surface of the fifth interlayer insulation film 240.

The second substrate 200 may include, as non-limiting examples, a semiconductor substrate, such as a silicon substrate, a germanium substrate, or a silicon-germanium substrate. Alternatively, the second substrate 200 may include a silicon-on-insulator (SOI) substrate, a germanium-on-insulator (GOI) substrate, and/or the like.

The peripheral circuit element PT may be formed on the upper surface of the second substrate 200 and may be covered by the fifth interlayer insulation film 240. The peripheral circuit element PT may form a peripheral circuit (for example, 30 of FIG. 1) that controls the operation of the semiconductor memory device. For example, the peripheral circuit element PT may include control logic (e.g., 37 of FIG. 1), a row decoder (e.g., 33 of FIG. 1), a page buffer (e.g., 35 of FIG. 1), and the like.

The peripheral circuit element PT may include, but is not limited to, for example, a transistor. For example, the peripheral circuit element PT may include active elements such as transistors, and/or passive elements such as capacitors, resistors, and inductors.

At least one first through via THV may be placed inside the first dam region RD. The first through via THV may extend in the third direction Z to penetrate through the first substrate 100 and the first pad structure PS1. The first through via THV may sequentially penetrate through the fourth interlayer insulation film 146, the third interlayer insulation film 144, the second interlayer insulation film 142, the first pad structure PS1, and the first substrate 100.

First through vias THV may not be placed inside the second dam region DD. The second pad structure PS2 may be a dummy pad structure in which the first through via THV is not formed.

In some embodiments, the first through via THV may penetrate through the first substrate 100 and may be connected to the peripheral circuit element PT. For example, a wiring structure PW connected to the peripheral circuit element PT may be formed inside the fifth interlayer insulation film 240. The first through via THV may be connected to the wiring structure PW. As a result, the wiring structure PW may electrically connect the first through via THV and the peripheral circuit element PT.

In some embodiments, the first substrate 100 may include a substrate hole 100t that exposes the fifth interlayer insulation film 240. The first interlayer insulation film 140 may fill the substrate hole 100t. The first through via THV may be placed inside the substrate hole 100t. As a result, the first through via THV may penetrate the first interlayer insulation film 140 and may be connected to the wiring structure PW.

In some embodiments, the first through via THV may be connected to the respective gate electrodes ECL, GSL, WL11 to WL1n, WL21 to WL2n, and SSL. For example, a gate contact 162 that penetrates through the second to fourth interlayer insulation films 142, 144, and 146 and is connected to each of the gate electrodes ECL, GSL, WL11 to WL1n, WL21 to WL2n, and SSL may be formed. Further, a connection wiring CL that connects the gate contact 162 and the first through via THV may be formed on the fourth interlayer insulation film 146. The first through via THV may be electrically connected to each of the gate electrodes ECL, GSL, WL11 to WL1n, WL21 to WL2n, and SSL through the connection wiring CL and the gate contact 162. As a result, the first through via THV may electrically connect the respective gate electrodes ECL, GSL, WL11 to WL1n, WL21 to WL2n, and SSL and the peripheral circuit element PT.

In some embodiments, the peripheral circuit element PT connected to the first through via THV may include a row decoder (33 of FIG. 1). That is, the first through via THV may electrically connect the respective gate electrodes ECL, GSL, WL11 to WL1n, WL21 to WL2n, and SSL and the row decoder (33 of FIG. 1).

A dam region (e.g., RD) may be provided in the mold structure to form a through via (e.g., THV) that penetrates the mold structure (e.g., MS1, MS2). However, the dam region may buckle due to the stress applied to the mold structure, which may become a cause of decrease in product reliability. For example, the interlayer insulation film (e.g., 142) that covers the mold structure may apply stress to the mold structure along the first direction Y, resulting in buckling of the dam region.

However, the memory device according to some embodiments includes a second dam region DD in which the first through via THV is not placed, and thus it may be possible to reduce stress applied to the dam region RD in which the first through via THV is placed. Specifically, as explained above, the second dam region DD may be spaced apart from the first dam region RD in the first direction Y. As a result, the stress applied to the mold structures MS1 and MS2 along the first direction Y may be dispersed to the second dam region DD, and stress applied to the first dam region RD may be reduced, and as such it may be possible to provide a semiconductor memory device in which the product reliability is improved.

Figure 6:
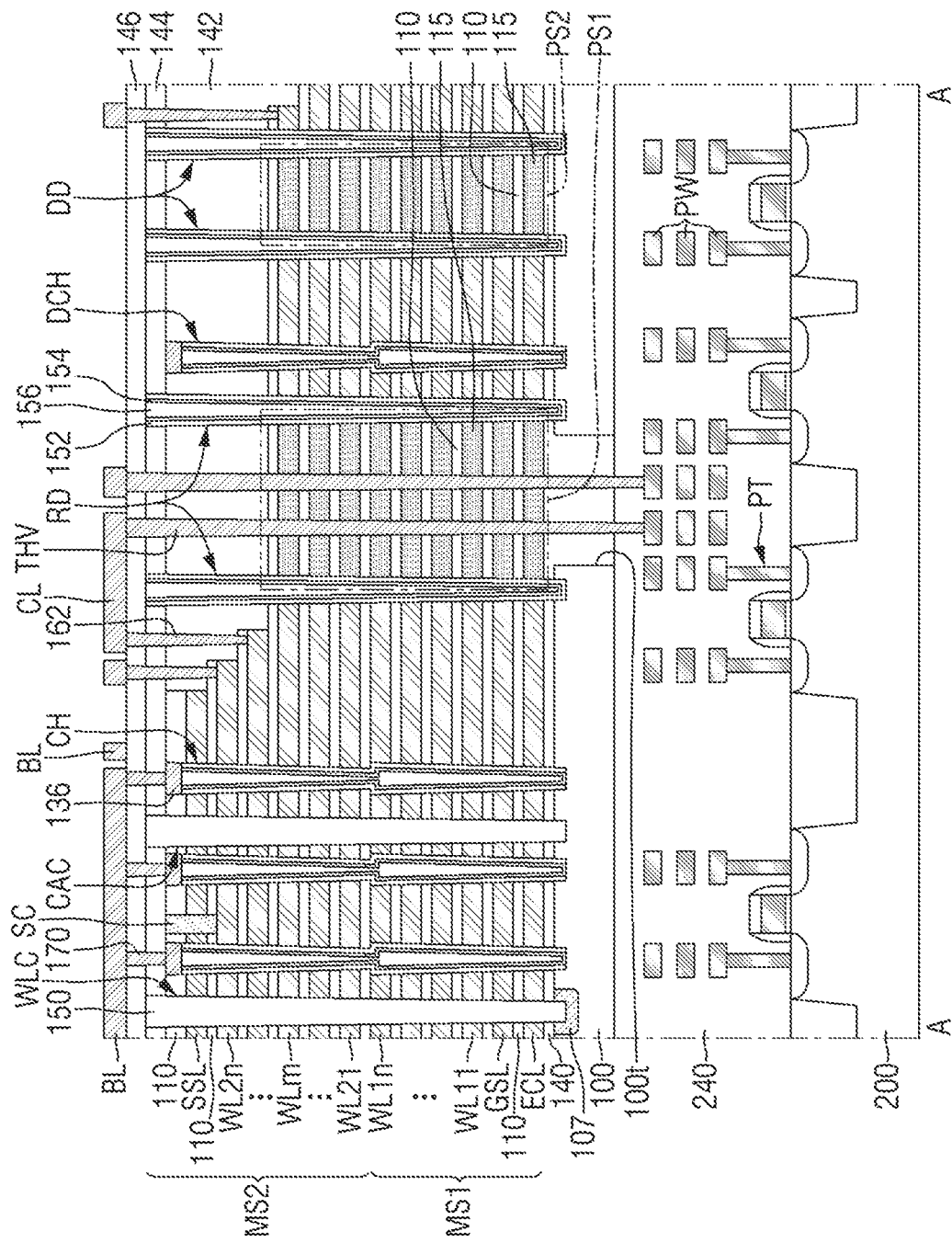
FIG. 6 is a cross-sectional view for explaining a semiconductor memory device according to some embodiments.

FIG. 6 is a cross-sectional view for explaining a semiconductor memory device according to some embodiments. For reference, FIG. 6 is another cross-sectional view taken along A-A of FIG. 3. For convenience of explanation, repeated parts of contents explained above using FIGS. 1 to 5 will be briefly explained or omitted.

Referring to FIG. 6, the semiconductor memory device according to some embodiments includes an impurity region 107.

The impurity region 107 may be formed in the first substrate 100. The impurity region 107 may extend in the first direction Y, and provided as a common source line (e.g., CSL of FIG. 2) of the semiconductor memory device.

In some embodiments, the block separation region WLC may include a conductive material. For example, the block separation region WLC may include a conductive pattern, and a spacer film that separates the mold structures MS1 and MS2 from the conductive pattern. The block separation region WLC may include the conductive pattern may be connected to the impurity region 107, and may be provided as a common source line (e.g., CSL of FIG. 2) of the semiconductor memory device.

In some embodiments, the source structure 105 of FIG. 4 may be omitted.

Figure 7:
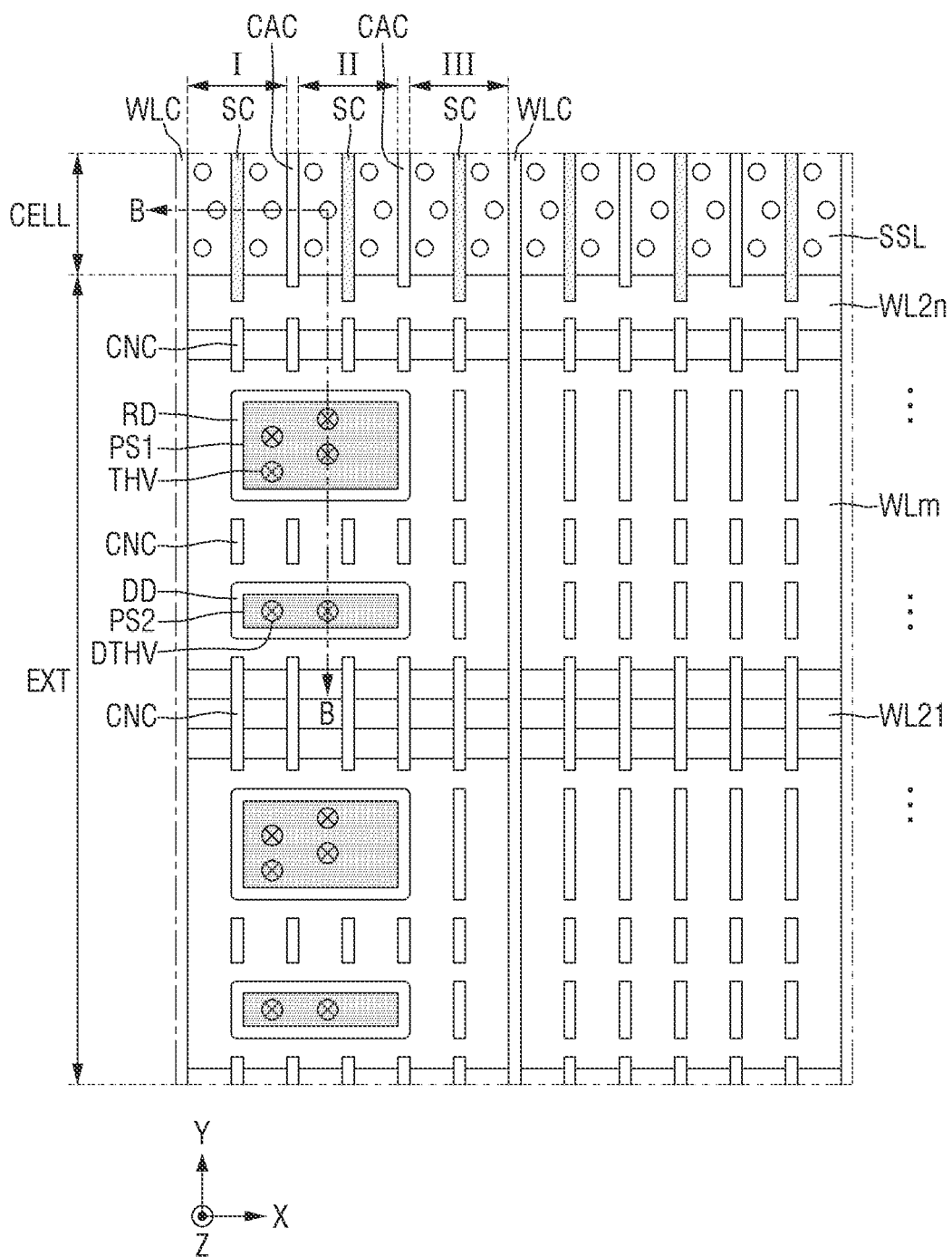
FIG. 7 is a layout diagram for explaining a semiconductor memory device according to some embodiments.
Figure 8:
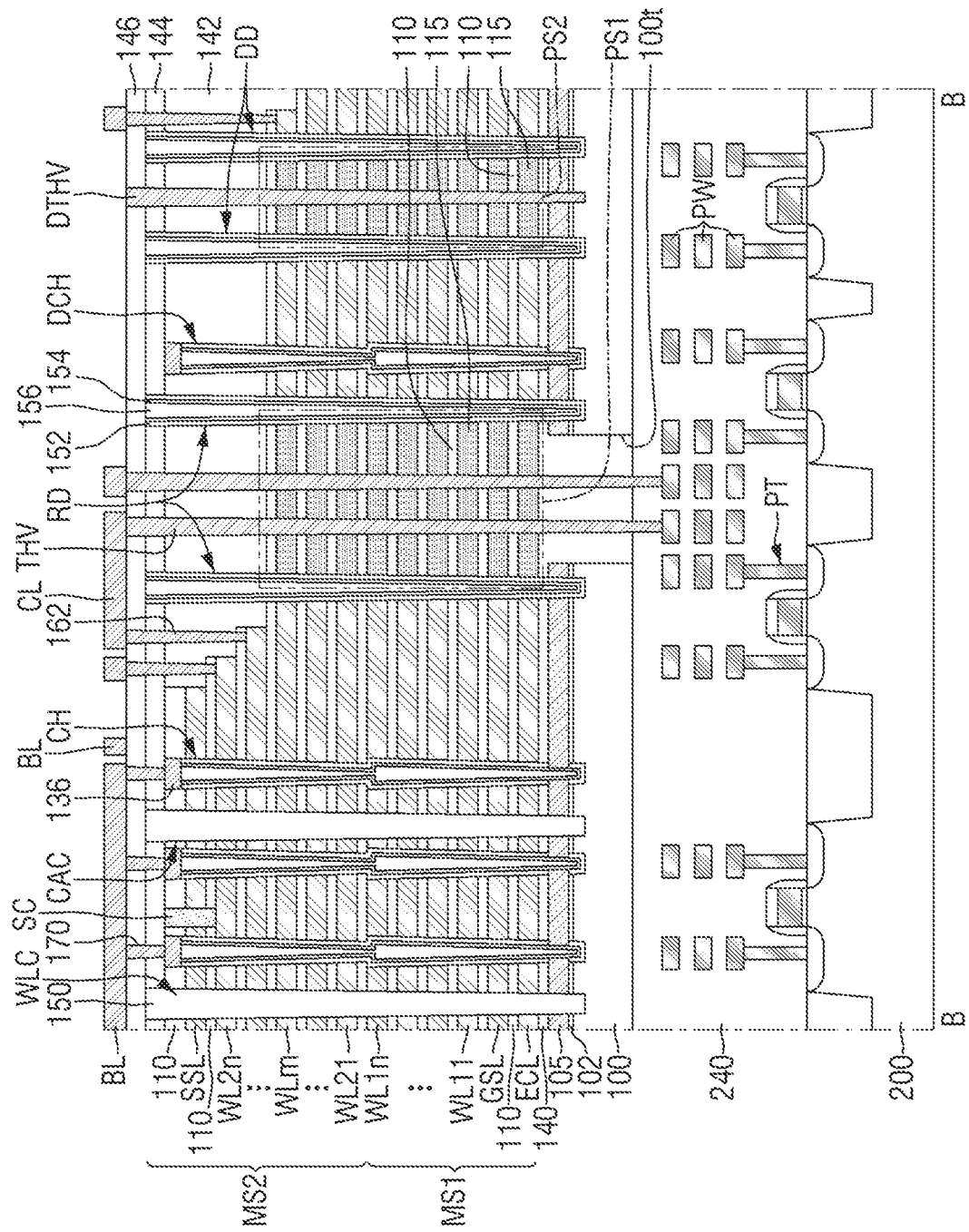
FIG. 8 is a cross-sectional view taken along B-B of FIG. 7.

FIG. 7 is a layout diagram for explaining a semiconductor memory device according to some embodiments. FIG. 8 is a cross-sectional view taken along B-B of FIG. 7. For convenience of explanation, repeated parts of contents explained above using FIGS. 1 to 5 will be briefly explained or omitted.

Referring to FIGS. 7 and 8, a semiconductor memory device according to some embodiments includes a second through via DTHV.

The second through via DTHV may be placed in the second dam region DD. The second through via DTHV that extends in the third direction Z and that may penetrate through the second pad structure PS2. For example, the second through via DTHV may sequentially penetrate through the fourth interlayer insulation film 146, the third interlayer insulation film 144, the second interlayer insulation film 142, and the second pad structure PS2.

In some embodiments, the second through via DTHV may not be connected to the peripheral circuit element PT. The second through via DTHV may extend into the first substrate 100 but may not penetrate through the first substrate 100. That is, the second through via DTHV may be a dummy through via that is not electrically connected to the peripheral circuit element PT.

In some embodiments, the second through via DTHV may not be connected to the respective gate electrodes ECL, GSL, WL11 to WL1n, WL21 to WL2n, and SSL. For example, the second through via DTHV may not be connected to the connection wiring CL.

Figure 9:
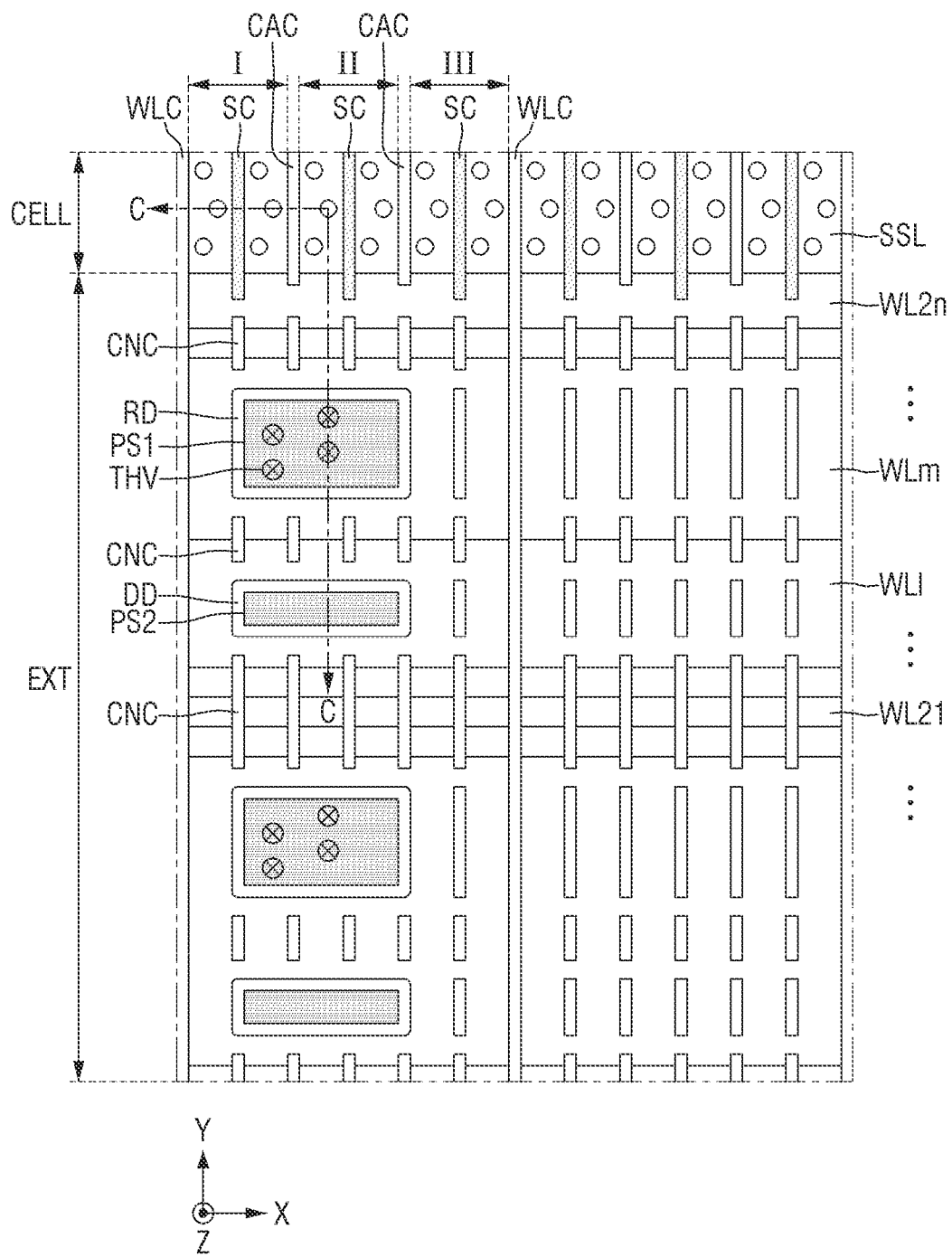
FIG. 9 is a layout diagram for explaining a semiconductor memory device according to some embodiments.
Figure 10:
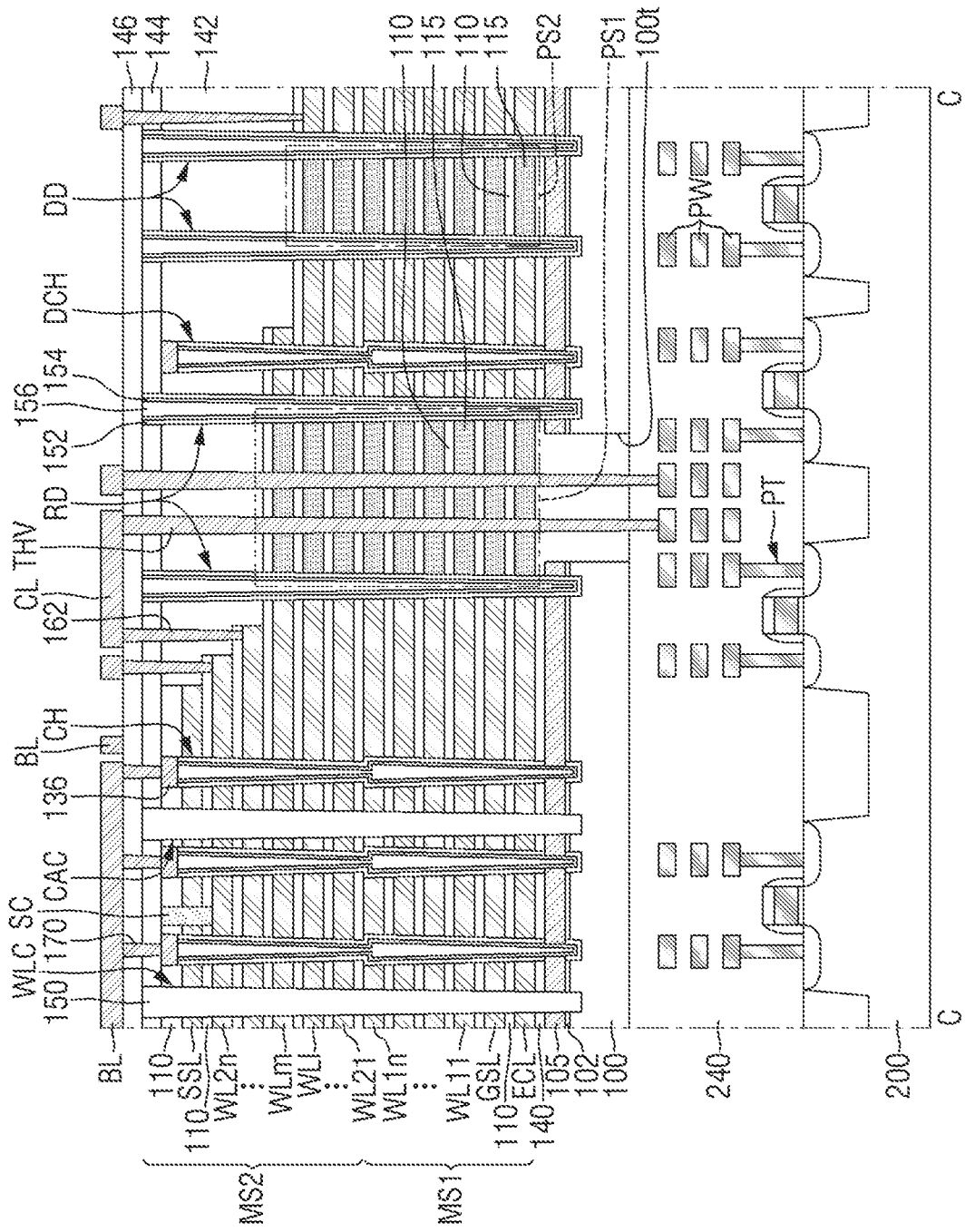
FIG. 10 is a cross-sectional view taken along C-C of FIG. 9.

FIG. 9 is a layout diagram for explaining a semiconductor memory device according to some embodiments. FIG. 10 is a cross-sectional view taken along C-C of FIG. 9. For convenience of explanation, repeated parts of contents explained above using FIGS. 1 to 5 will be briefly explained or omitted.

Referring to FIGS. 9 and 10, the height of the first pad structure PS1 may be different from the height of the second pad structure PS2 from the upper surface of the first substrate 100.

For example, the mold structures MS1 and MS2 may include a first pad gate electrode WLm and a second pad gate electrode WL1 that are stacked in a stepped manner in the extension region EXT. The first pad gate electrode WLm may be stacked on the second pad gate electrode WL1. In the extension region EXT, the second pad gate electrode WL1 may be exposed from the gate electrodes (e.g., WLm to WL2n, and SSL) stacked thereon. The first dam region RD may be formed in the exposed region of the first pad gate electrode WLm, and the second dam region DD may be formed in the exposed region of the second pad gate electrode WL1.

As a result, a height of the first pad structure PS1 may be higher than a height of the second pad structure PS2 from the upper surface of the first substrate 100. The uppermost pad insulation film 115 of the first pad structure PS1 may be stacked at the same level as the first pad gate electrode WLm, and the uppermost pad insulation film 115 of the second pad structure PS2 may be stacked at the same level as the second pad gate electrode WL1.

Although the drawing shows that the height of the first pad structure PS1 is higher than the height of the second pad structure PS2 from the upper surface of the first substrate 100, this is only an example. As another example, the first dam region RD may be formed inside the exposed region of the second pad gate electrode WL1, and the second dam region DD be formed in the exposed region of the first pad gate electrode WLm. As such, the height of the first pad structure PS1 may be smaller than the height of the second pad structure PS2 from the upper surface of the first substrate 100.

Although both the first pad gate electrode WLm and the second pad gate electrode WL1 are shown as being included in the second mold structure MS2, this is only an example, and the first pad gate electrode WLm and/or the second pad gate electrode WL1 may be included in the first mold structure MS1.

Figure 11:
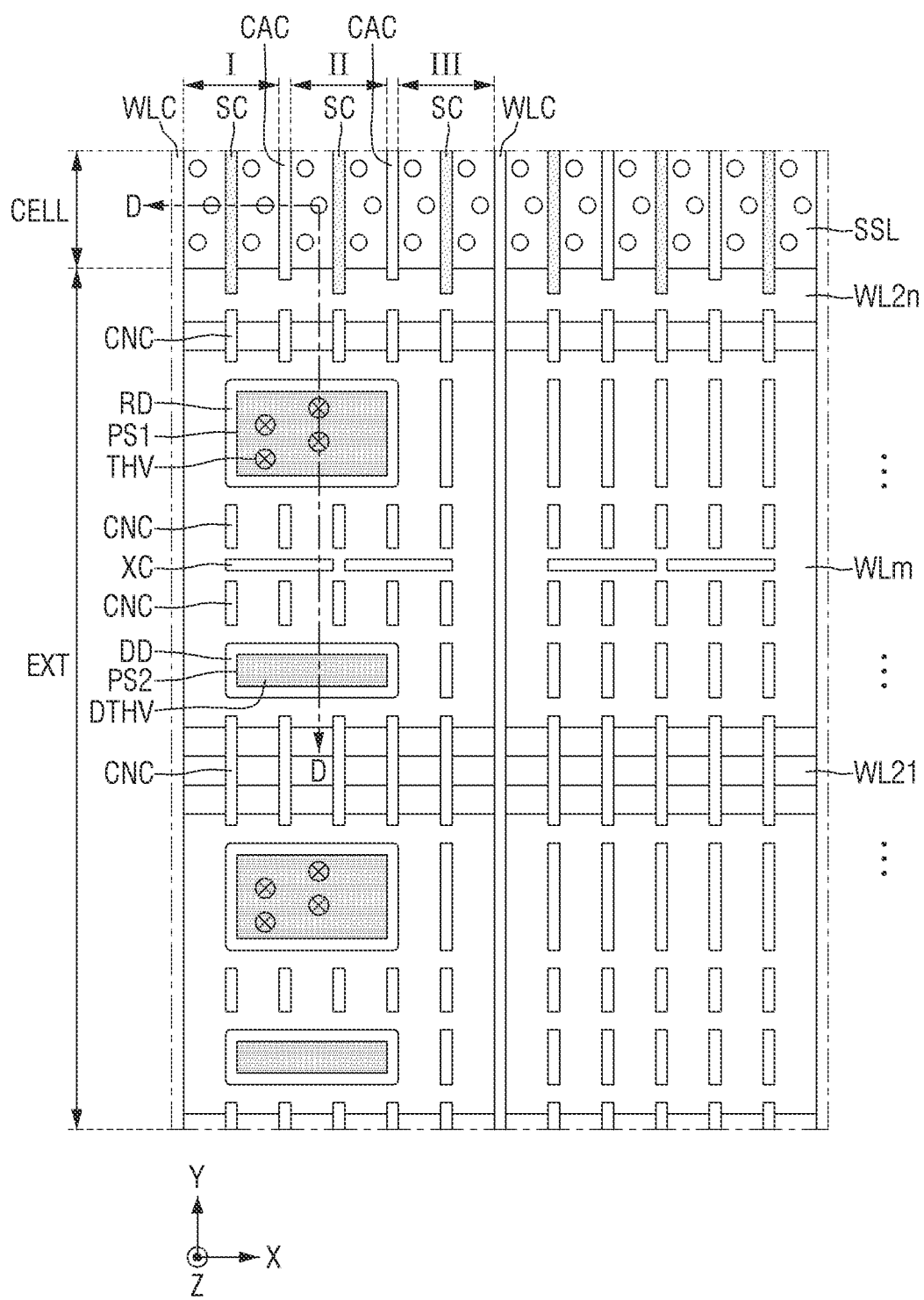
FIG. 11 is a layout diagram for explaining the semiconductor memory device according to some embodiments.
Figure 12:
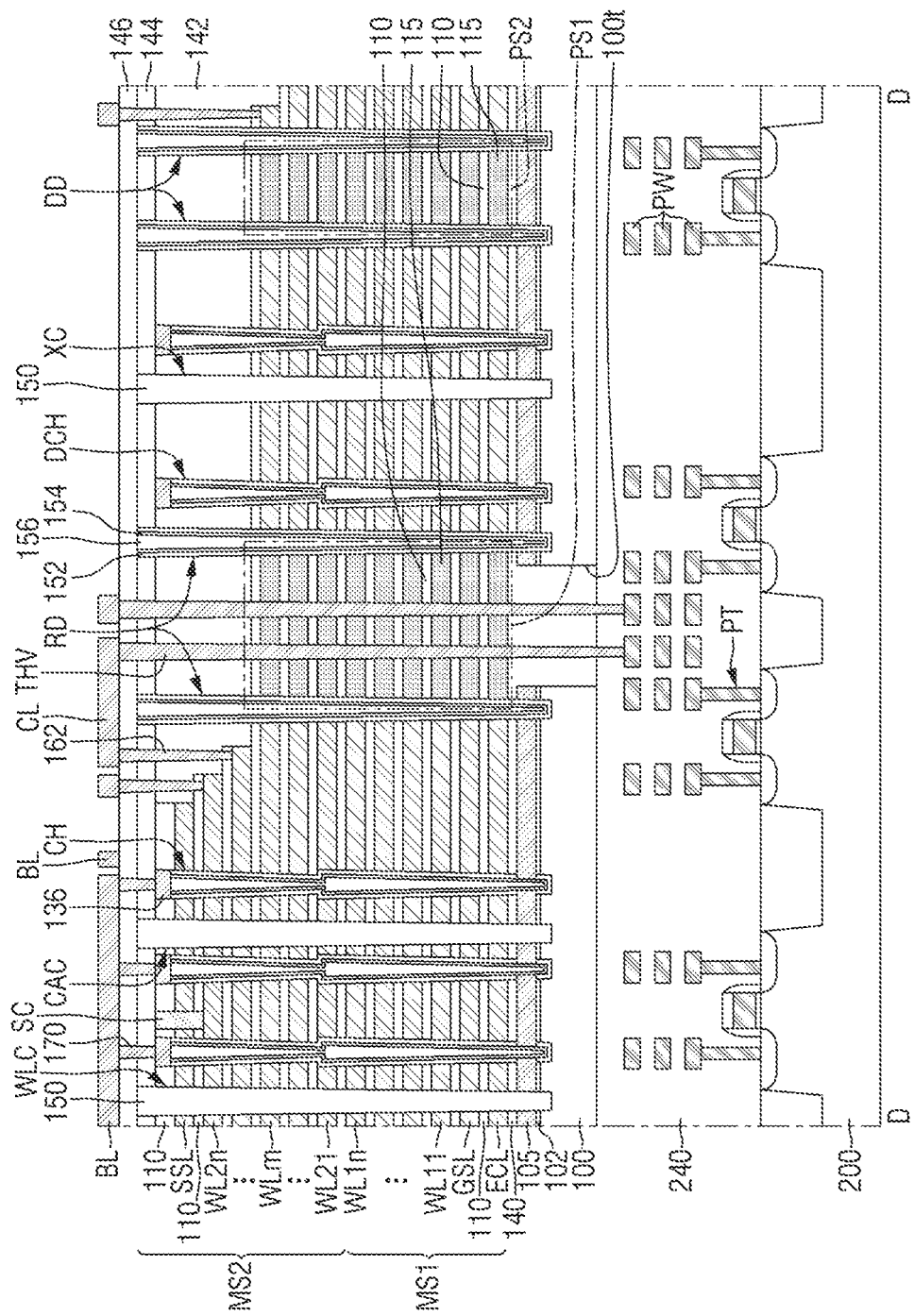
FIG. 12 is a cross-sectional view taken along D-D of FIG. 11.

FIG. 11 is a layout diagram for explaining the semiconductor memory device according to some embodiments. FIG. 12 is a cross-sectional view taken along D-D of FIG. 11. For convenience of explanation, repeated parts of contents explained above using FIGS. 1 to 5 will be briefly explained or omitted.

Referring to FIGS. 11 and 12, the semiconductor memory device according to some embodiments may include a cross gate cutting region XC.

The cross gate cutting region XC is formed in the extension region EXT and may cut a plurality of gate electrodes ECL, GSL, WL11 to WL1n, WL21 to WL2n, and SSL. Also, the cross gate cutting region XC may intersect the extension gate cutting region CNC. For example, the cross gate cutting region XC may extend in the second direction X to cut the mold structures MS1 and MS2 in the extension region EXT. In some embodiments, a plurality of cross gate cutting regions XC may be arranged in the extension region EXT along the second direction X.

The cross gate cutting region XC may be spaced apart from the first dam region RD. In some embodiments, the cross gate cutting region XC may be spaced apart from the first dam region RD in the first direction Y. A spaced distance between the first dam region RD and the cross gate cutting region XC may be, for example, about 2 μm to about 5 μm. As an example, a spaced distance D1 between the first dam region RD and the cross gate cutting region XC may be about 3 μm to about 4 μm.

Although the cross gate cutting region XC is shown as being interposed between the first dam region RD and the second dam region DD, this is only an example. In some embodiments, the second dam region DD may be interposed between the first dam region RD and the cross gate cutting region XC. In some embodiments, the first dam region RD may be interposed between the cross gate cutting region XC and the second dam region DD.

In some embodiments, the cross gate cutting region XC may include a first material pattern 150. The first material pattern 150 may fill the cross gate cutting region XC. In some embodiments, the first pattern material 150 that fills the cross gate cutting region XC may be the same material that fills the block separation region WLC.

In some embodiments, the block separation region WLC, the cell gate cutting region CAC, the extension gate cutting region CNC, and the cross gate cutting region XC may be formed at the same level.

Hereinafter, operations of methods for fabricating a semiconductor memory device according to exemplary embodiments will be explained referring to FIGS. 1 to 22.

FIGS. 13 to 22 are intermediate stage diagrams for explaining the method for fabricating the semiconductor memory device according to some embodiments. For convenience of explanation, repeated parts of contents explained above using FIGS. 1 to 12 will be briefly explained or omitted.

Figure 13:
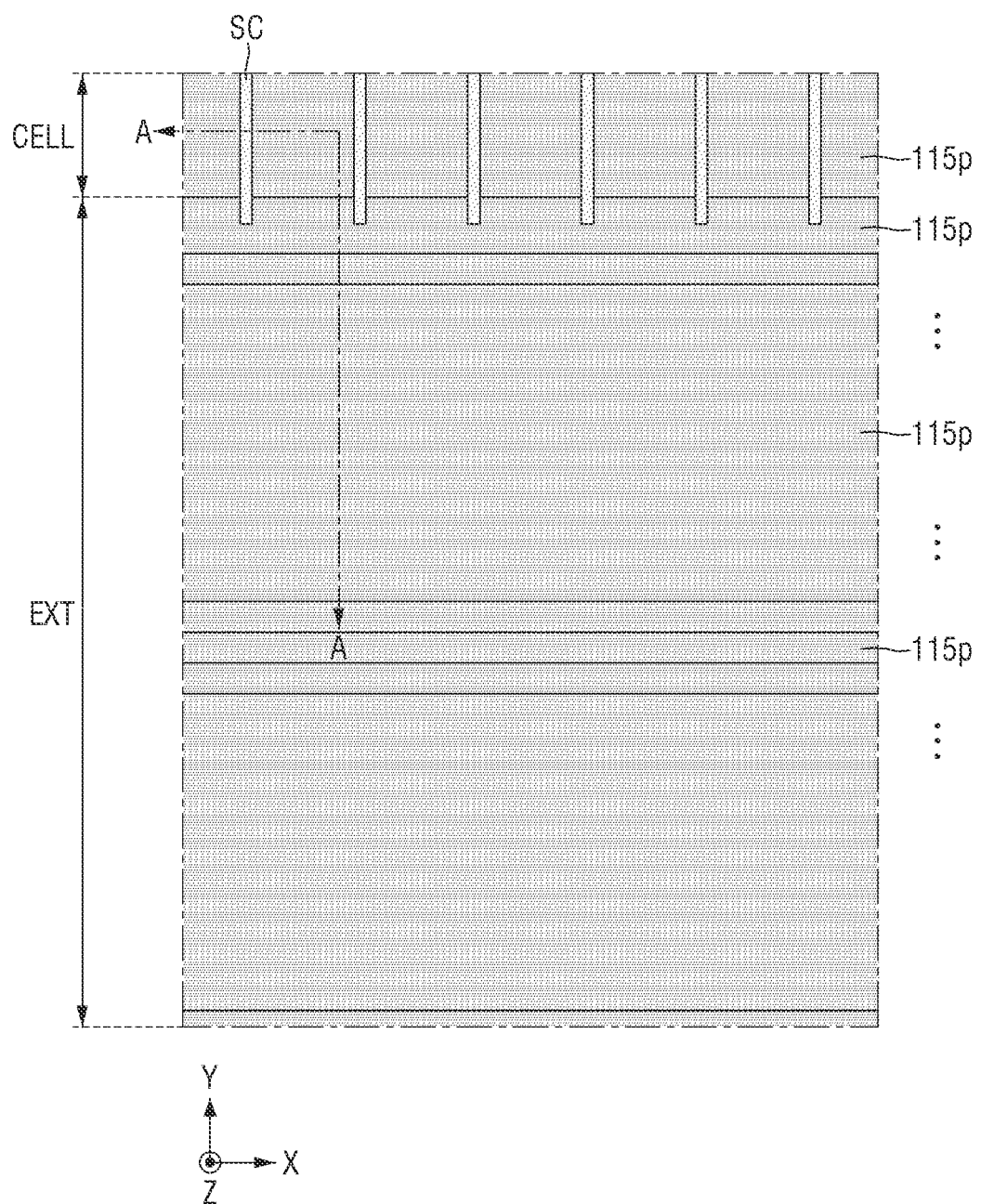
FIGS. 13 to 22 are intermediate stage diagrams for explaining the method for fabricating the semiconductor memory device according to some embodiments.
Figure 14:
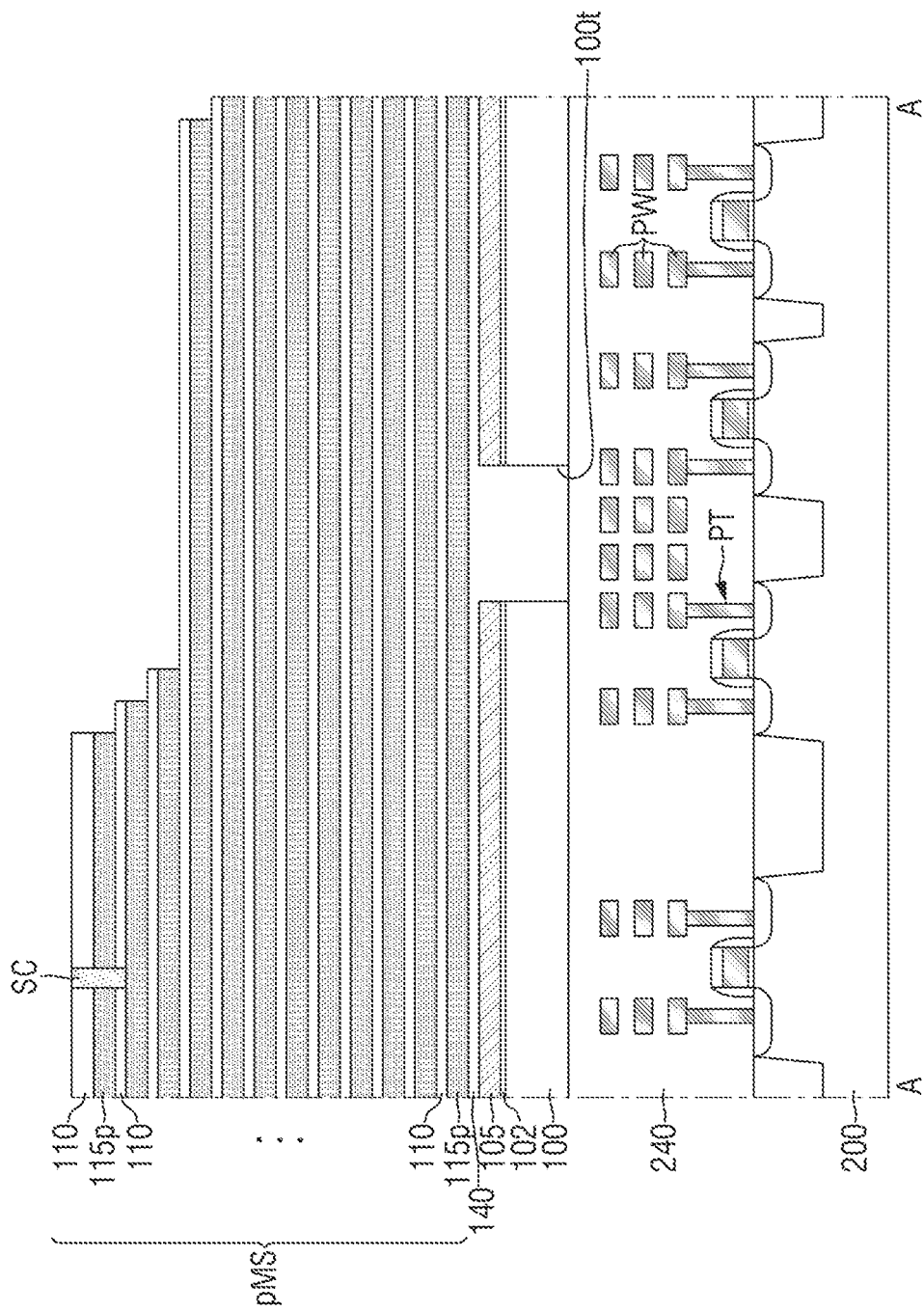

Referring to FIGS. 13 and 14, a first substrate 100 and a preliminary mold structure pMS may be formed on a second substrate 200. For reference, FIG. 14 is a cross-sectional view taken along A-A of FIG. 13.

The first substrate 100 may be formed on the second substrate 200. For example, a fifth interlayer insulation film 240 that covers the second substrate 200 may be formed on the second substrate 200. The first substrate 100 may be stacked on the upper surface of the fifth interlayer insulation film 240.

The preliminary mold structure pMS may be formed on the first substrate 100. For example, a first interlayer insulation film 140 that covers the first substrate 100 may be formed on the first substrate 100. The preliminary mold structure pMS may be stacked on the upper surface of the first interlayer insulation film 140. The preliminary mold structure pMS may include a plurality of sacrificial films 115p and a plurality of mold insulation films 110 that are alternately stacked on the first substrate 100.

The sacrificial films 115p and the mold insulation films 110 may have different etch selectivity from each other. As an example, the sacrificial films 115p may include a silicon nitride film, and the mold insulation films 110 may include a silicon oxide film.

In some embodiments, a string separation structure SC may be formed in the preliminary mold structure pMS of the cell array region CELL. The string separation structure SC extends in the first direction Y and may cut the uppermost sacrificial film 115p.

The sacrificial films 115p may be stacked in the extension region EXT in a stepped manner. For example, the preliminary mold structure pMS of the extension region EXT may be patterned in a stepped manner.

Figure 15:
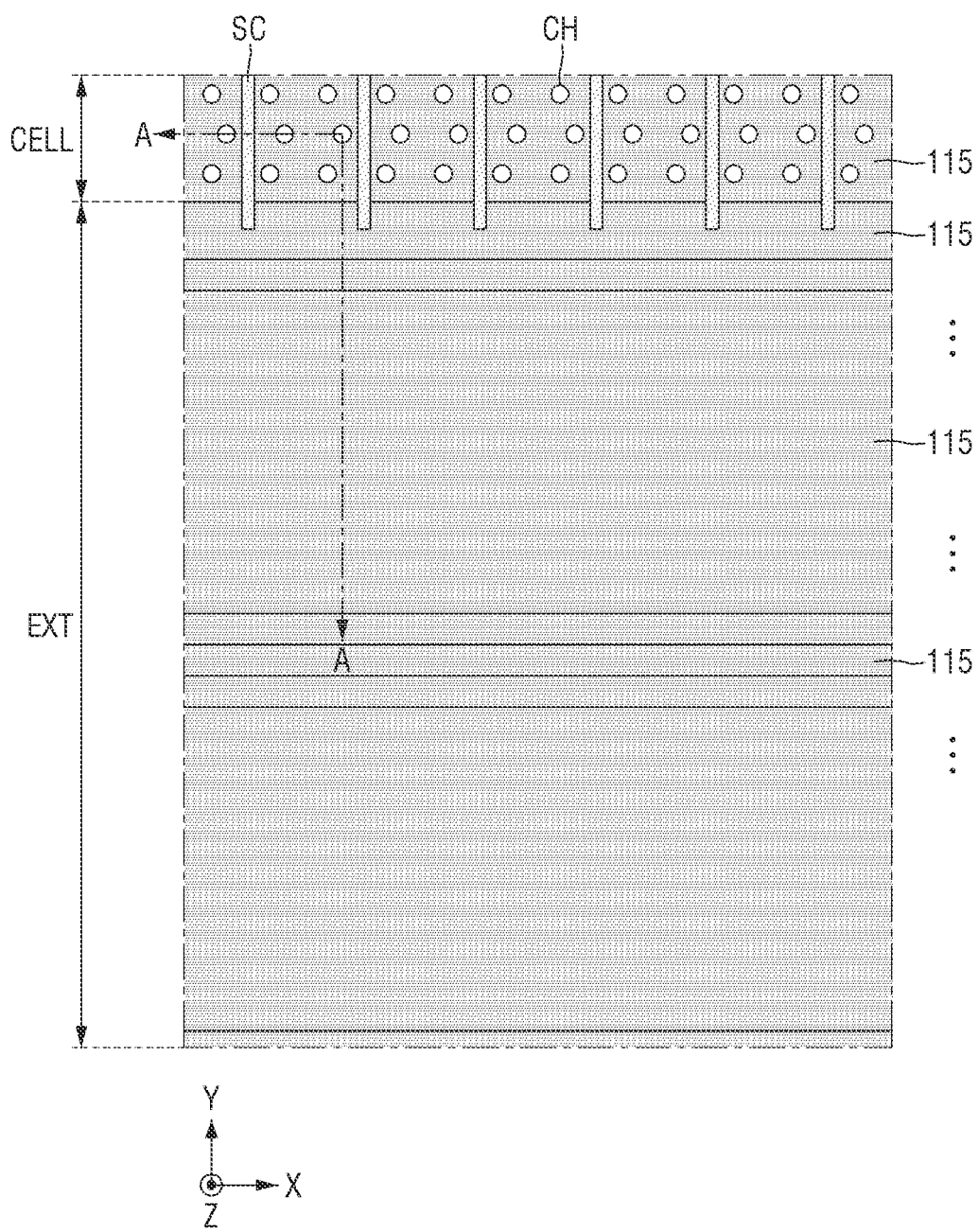
Figure 16:
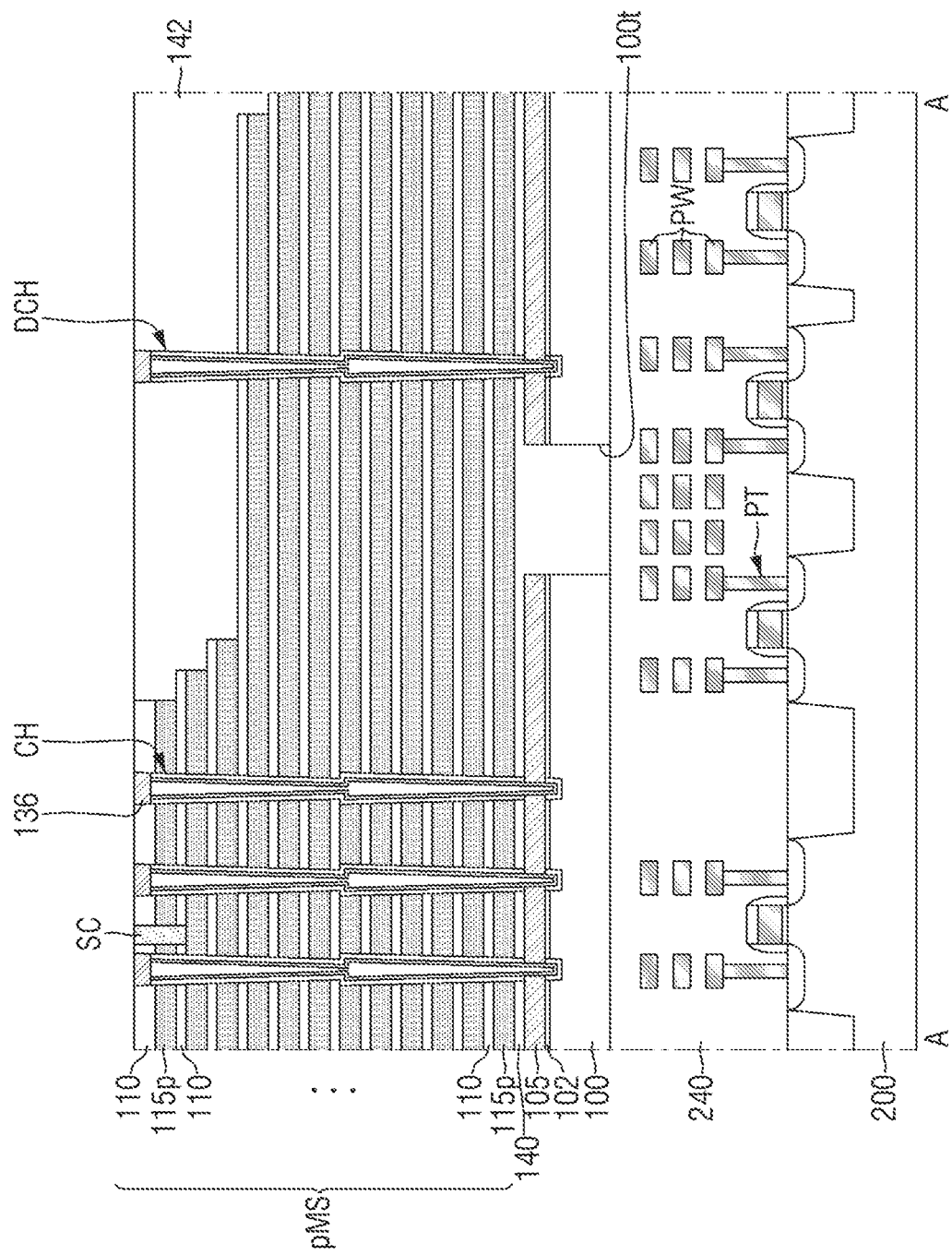

Referring to FIGS. 15 and 16, a channel structure CH is formed in the preliminary mold structure pMS. For reference, FIG. 16 is a cross-sectional view taken along A-A of FIG. 15.

The channel structure CH may penetrate through the preliminary mold structure pMS. The channel structure CH may intersect a plurality of sacrificial films 115p. For example, the channel structure CH may have a pillar shape (e.g., a columnar shape) extending in the third direction Z.

In some embodiments, a second interlayer insulation film 142 may be formed on the first substrate 100. The second interlayer insulation film 142 may cover the preliminary mold structure pMS. The second interlayer insulation film 142 may include, as non-limiting examples, at least one of silicon oxide, silicon oxynitride, and/or a low dielectric constant (low-k) material having a lower dielectric constant than that of silicon oxide.

In some embodiments, a dummy channel structure DCH having a shape similar to that of the channel structure CH may be formed in the preliminary mold structure pMS of the extension region EXT. The dummy channel structure DCH may penetrate through the second interlayer insulation film 142 and the preliminary mold structure pMS.

Figure 17:
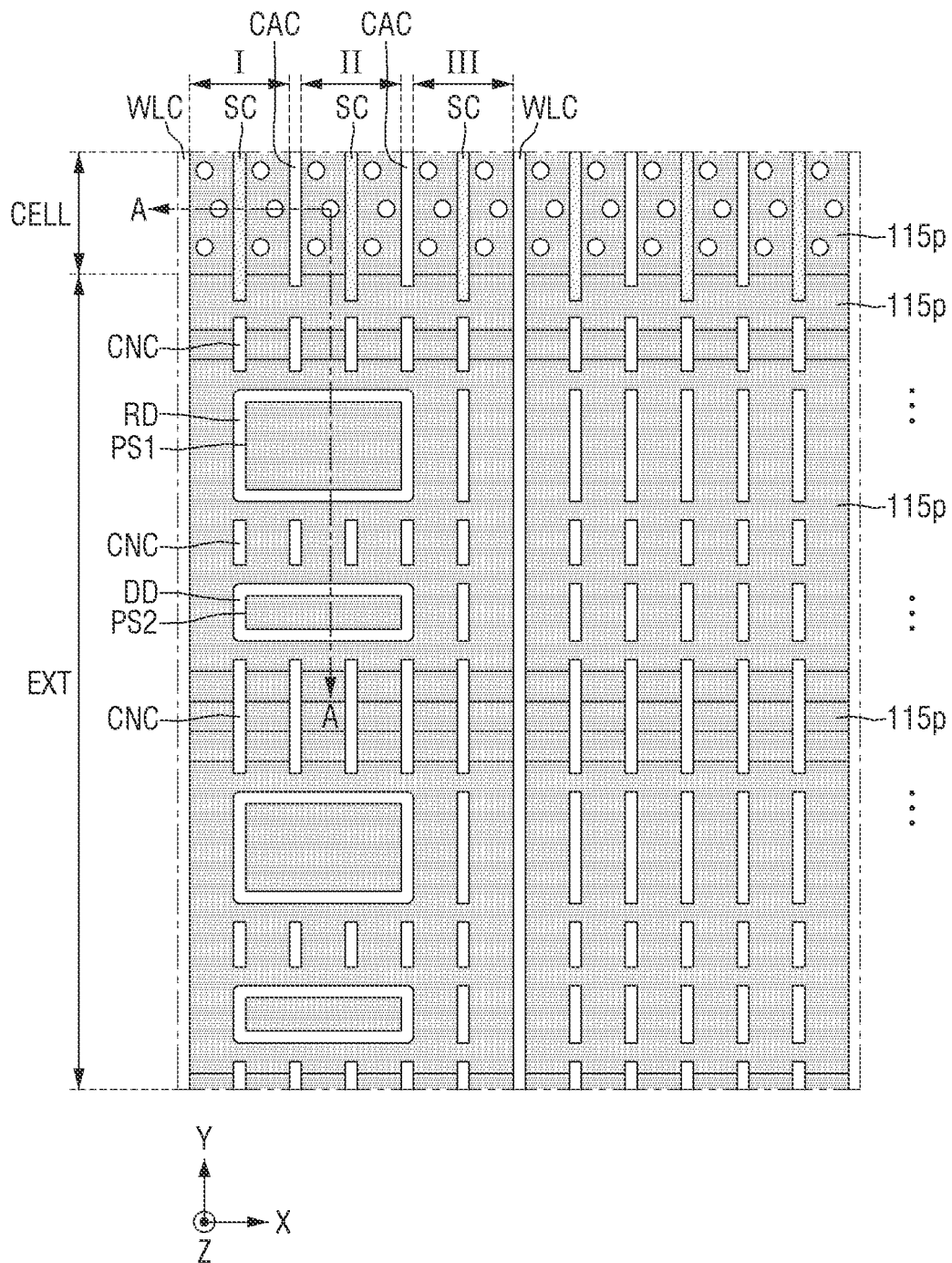
Figure 18:
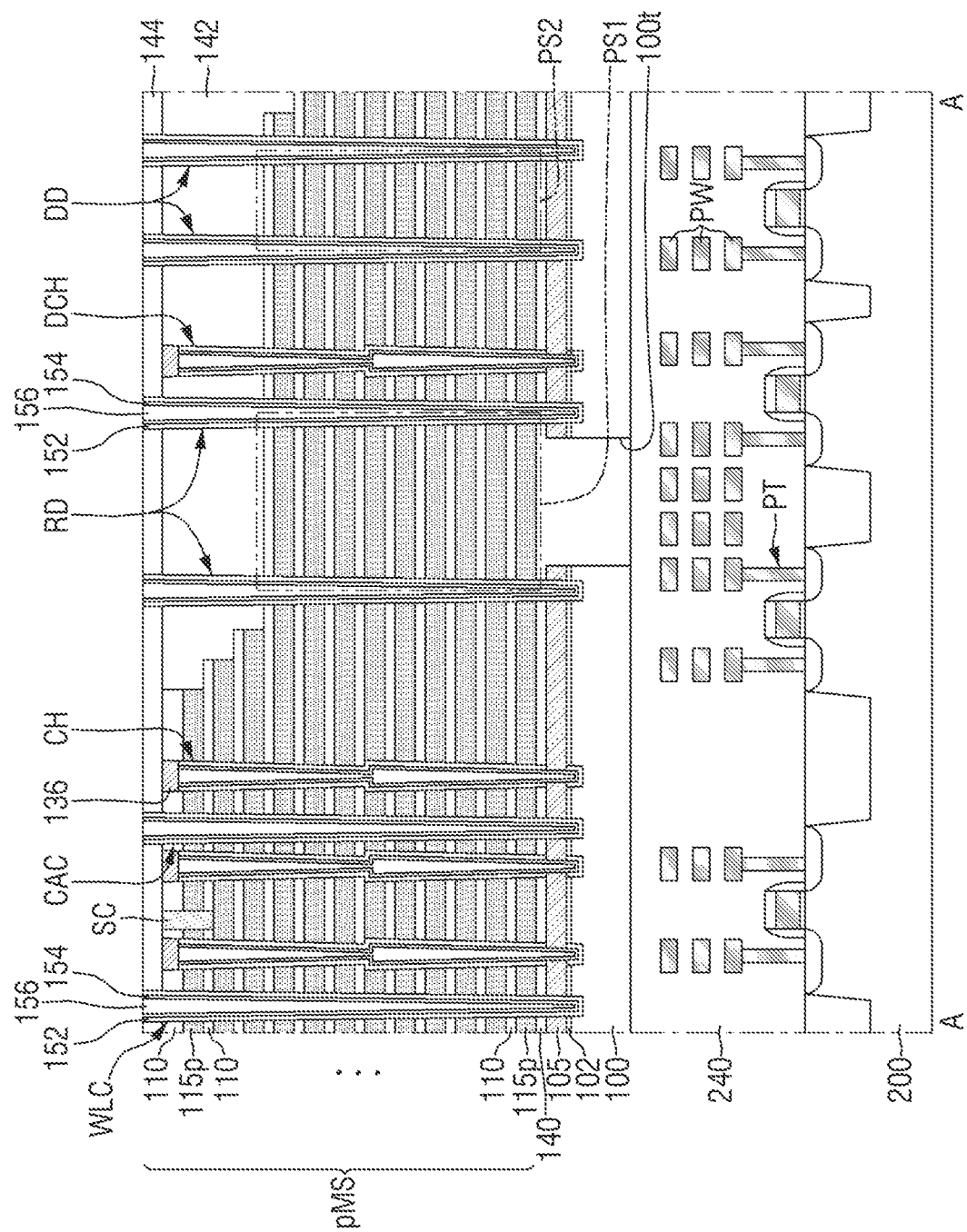

Referring to FIGS. 17 and 18, the block separation region WLC, the cell gate cutting region CAC, the extension gate cutting region CNC, the first dam region RD, and the second dam region DD are formed in the preliminary mold structure pMS. For reference, FIG. 18 is a cross-sectional view taken along A-A of FIG. 17.

The block separation region WLC may extend in the first direction Y to cut (e.g., completely cut) the preliminary mold structure pMS in the cell array region CELL and the extension region EXT.

The cell gate cutting region CAC may extend in the first direction Y to cut the preliminary mold structure pMS in the cell array region CELL.

The extension gate cutting region CNC may extend in the first direction Y to cut the preliminary mold structure pMS in the extension region EXT.

The first dam region RD and the second dam region DD may each cut the preliminary mold structure pMS. In some embodiments, the first dam region RD and the second dam region DD may be formed in the preliminary mold structure pMS of the extension region EXT. The second dam region DD may be spaced apart from the first dam region RD in the first direction Y.

The first dam region RD and the second dam region DD may each form a closed loop in a plane parallel to the upper surface of the first substrate 100 (for example, a plane extending in the first direction Y and the second direction X). As a result, a first pad structure PS1 isolated by the first dam region RD may be formed, and a second pad structure PS2 isolated by the second dam region DD may be formed. The first pad structure PS1 and the second pad structure PS2 may include a plurality of sacrificial films 115$p$ and a plurality of mold insulation films 110 that are alternately stacked on the first substrate 100.

In some embodiments, the block separation region WLC, the cell gate cutting region CAC, the extension gate cutting region CNC, the first dam region RD and the second dam region DD may each include second material patterns 152, 154, and 156. The second material patterns 152, 154, and 156 may be formed to fill the block separation region WLC, the cell gate cutting region CAC, the extension gate cutting region CNC, the first dam region RD, and the second dam region DD.

The sacrificial film 115$p$ and the second material patterns 152, 154, and 156 may have different etch selectivity from each other. As an example, the sacrificial film 115$p$ may include a silicon nitride film, and the first material film 152 may include a silicon oxide film.

In some embodiments, the block separation region WLC, the cell gate cutting region CAC, the extension gate cutting region CNC, the first dam region RD, and the second dam region DD may be formed at the same level. For example, the block separation region WLC, the cell gate cutting region CAC, the extension gate cutting region CNC, the first dam region RD and the second dam region DD that cut the preliminary mold structure may be formed at the same time and/or via a single process or operation.

Figure 19:
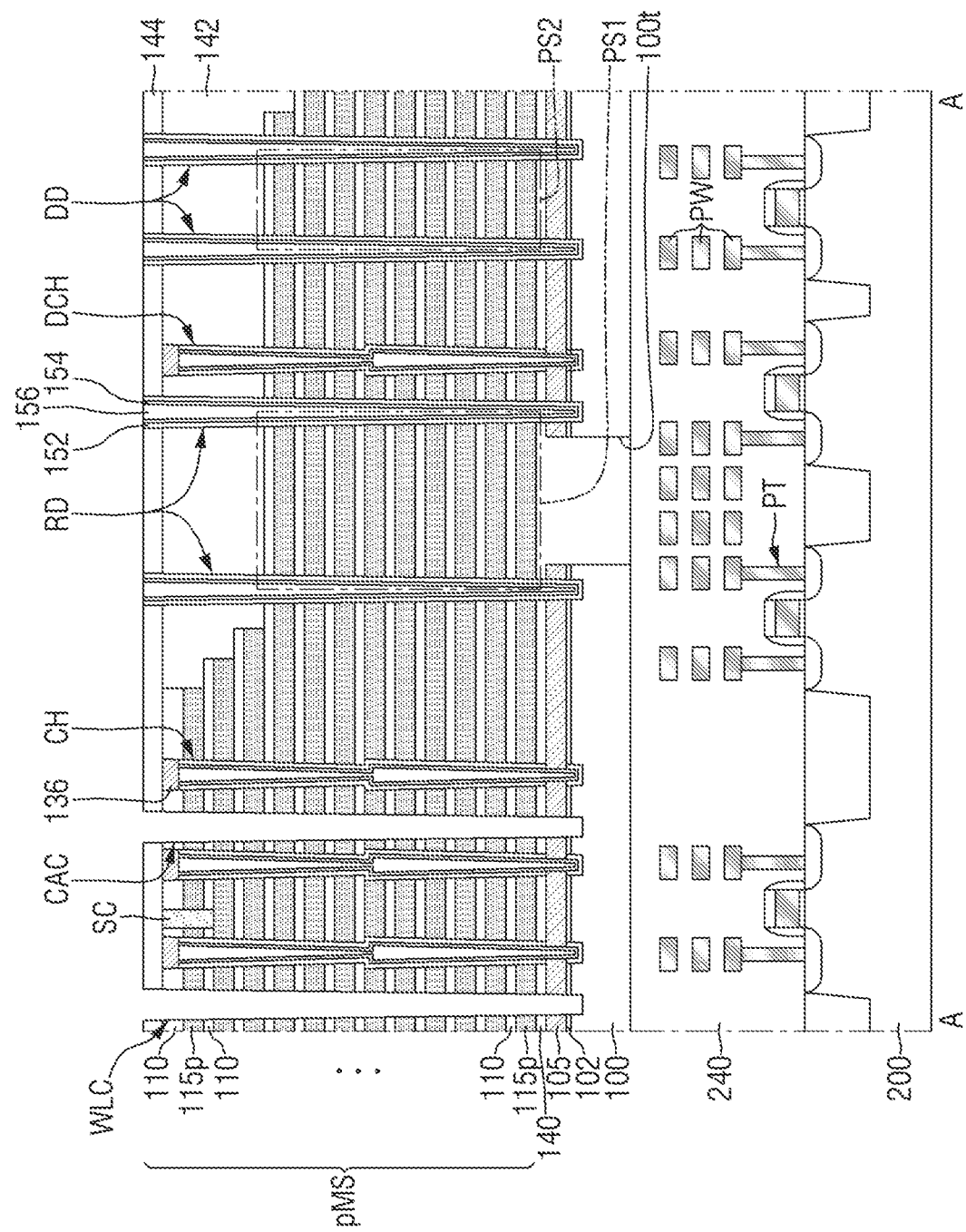

Referring to FIG. 19, the second material patterns 152, 154, and 156 that fills the block separation region WLC, the cell gate cutting region CAC and the extension gate cutting region CNC may be removed.

The second material patterns 152, 154, and 156 that fill the first dam region RD and the second dam region DD may not be removed. For example, a mask pattern, which may expose the block separation region WLC, the cell gate cutting region CAC and the extension gate cutting region CNC and may cover the first dam region RD and the second dam region DD, may be formed on the preliminary mold structure pMS. The mask pattern may selectively remove the second material patterns 152, 154, and 156 that fill the block separation region WLC, the cell gate cutting region CAC, and the extension gate cutting region CNC.

Figure 20:
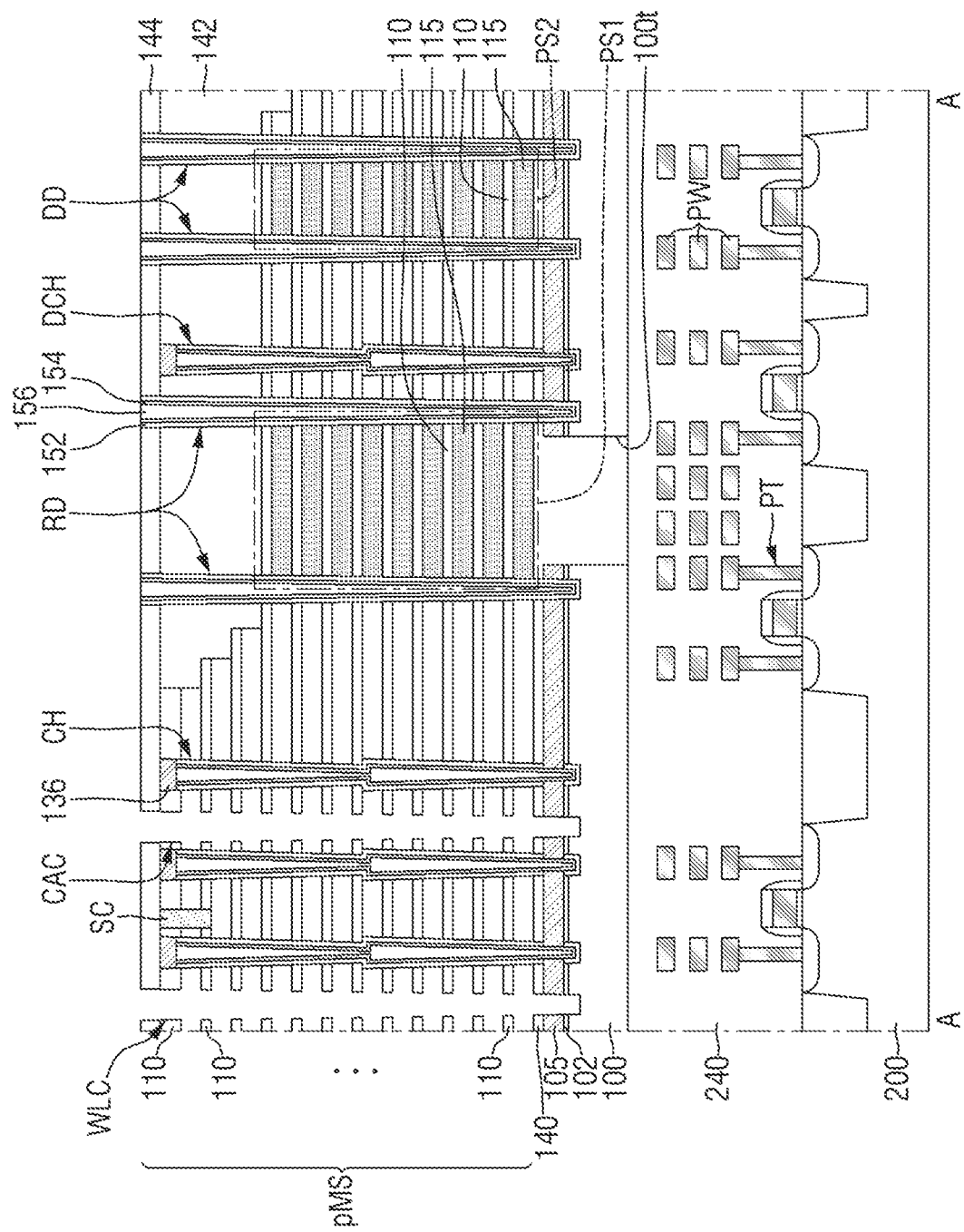

Referring to FIG. 20, the sacrificial films 115$p$ exposed by the block separation region WLC, the cell gate cutting region CAC, and the extension gate cutting region CNC may be removed.

As described above, since the sacrificial films 115$p$ and the mold insulation films 110 may have different etch selectivity from each other, the sacrificial films 115$p$ may be selectively removed. Also, as mentioned above, since the sacrificial films 115$p$ and the second material patterns 152, 154, and 156 may have different etch selectivity from each other, the sacrificial films 115$p$ of the first pad structure PS1 may be protected by the first dam region RD, and the sacrificial films 115$p$ of the second pad structure PS2 may be protected by the second dam region DD. That is, the sacrificial films 115$p$ outside the first dam region RD and the second dam region DD may be selectively removed.

As a result, the first pad structure PS1 and the second pad structure PS2 including the pad insulation film 115 and the mold insulation film 110 which are alternately stacked may be formed.

Figure 21:
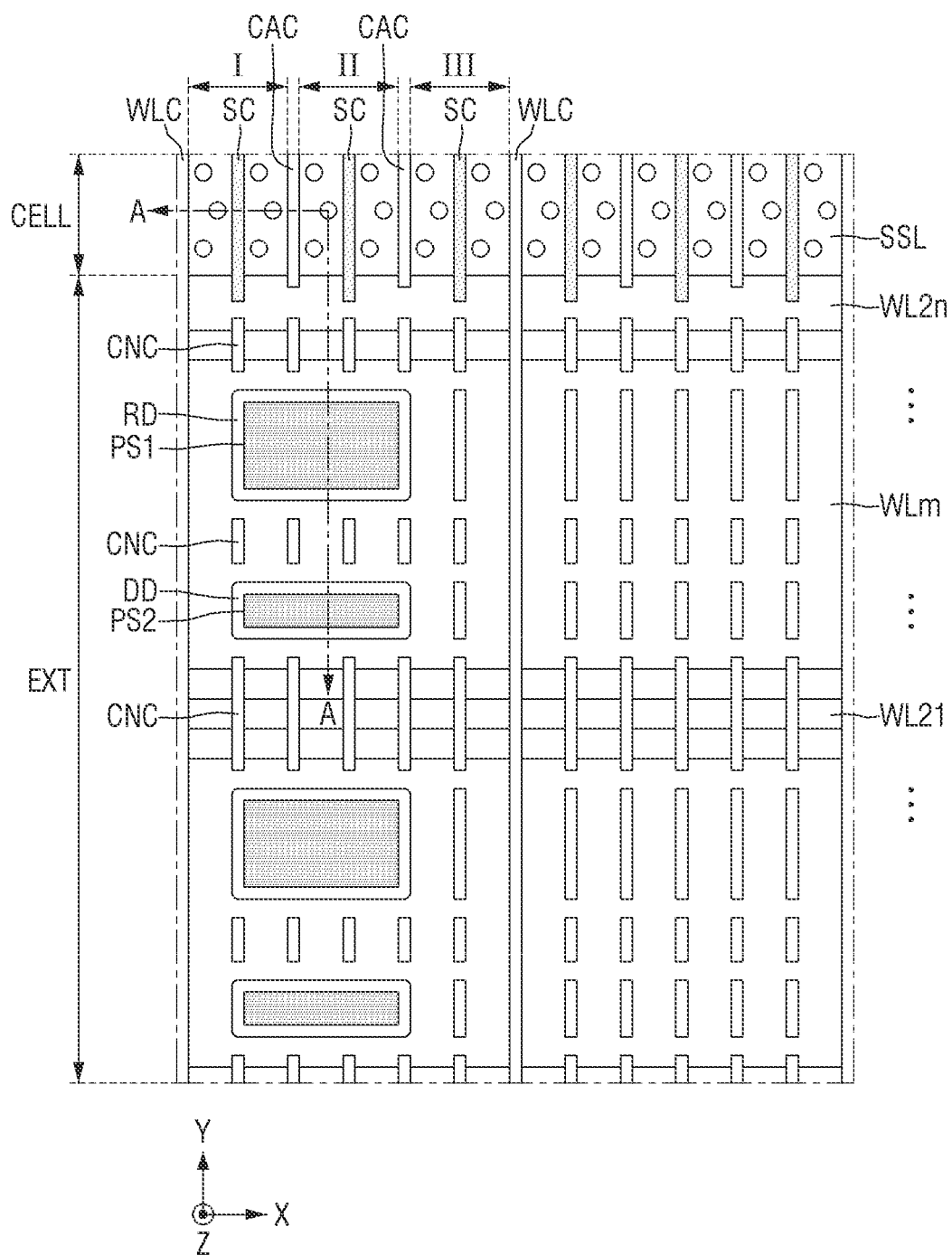
Figure 22:
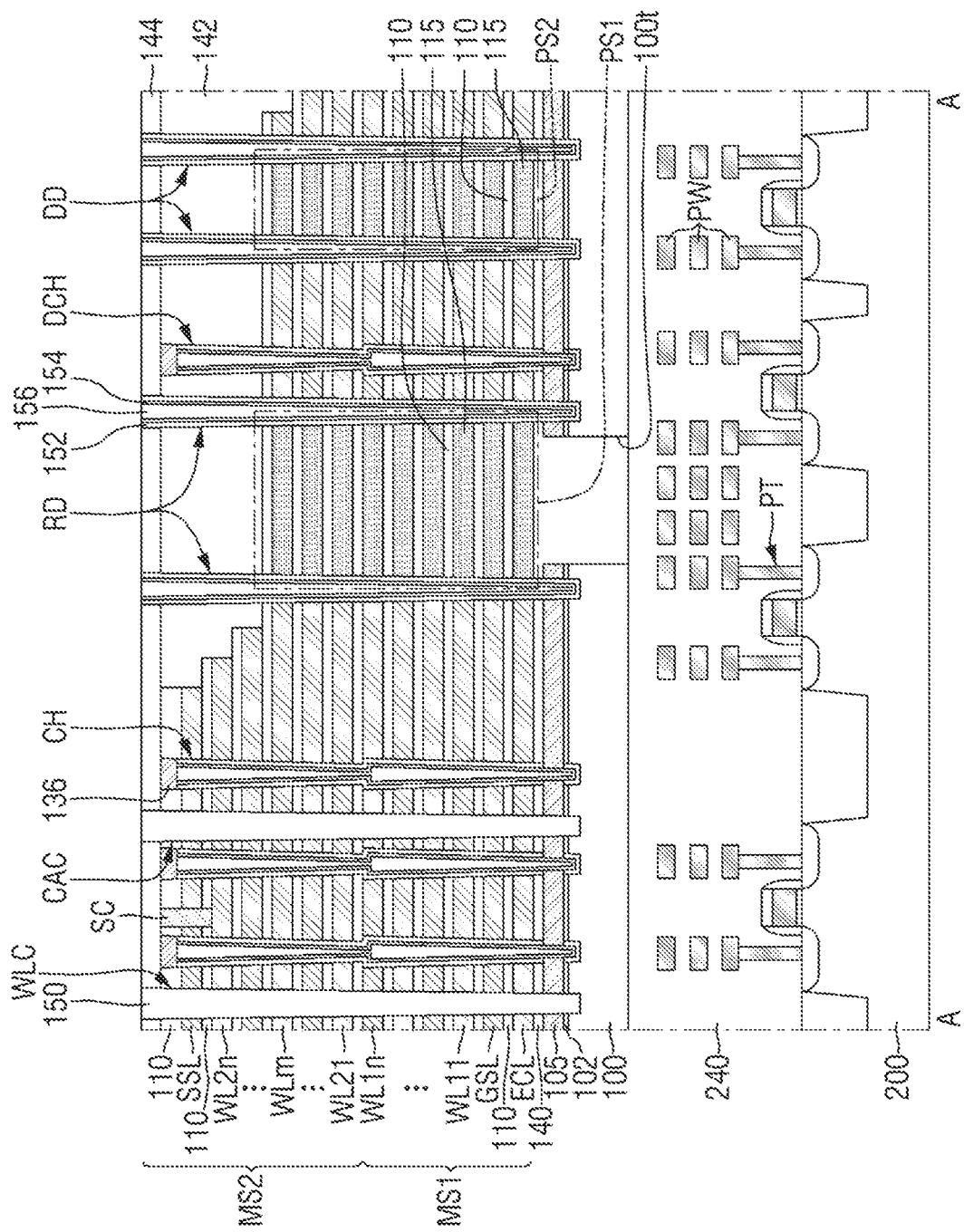

Referring to FIGS. 21 and 22, gate electrodes ECL, GSL, WL11 to WL1$n$, WL21 to WL2$n$, and SSL are formed.

For example, the gate electrodes ECL, GSL, WL11 to WL1$n$, WL21 to WL2$n$, and SSL may be formed in regions in which parts of the sacrificial films 115$p$ are removed. That is, parts of the removed sacrificial films 115$p$ may be replaced with the gate electrodes ECL, GSL, WL11 to WL1$n$, WL21 to WL2$n$, and SSL. As a result, the mold structures MS1 and MS2 may be formed that include the gate electrodes ECL, GSL, WL11 to WL1$n$, WL21 to WL2$n$, and SSL alternately stacked with the mold insulation films 110.

Subsequently, a first material pattern 150 that fills the block separation region WLC, the cell gate cutting region CAC, and the extension gate cutting region CNC may be formed.

Subsequently, referring to FIGS. 3 and 4, the gate contact 162, the bit line contact 170, the first through via THV, the bit line BL, and the connection wirings CL may be formed. Accordingly, a method for fabricating a semiconductor memory device in which product reliability is improved.

Hereinafter, an electronic system including the semiconductor memory device according to the exemplary embodiments will be explained referring to FIGS. 1 to 12 and 23 to 25.

Figure 23:
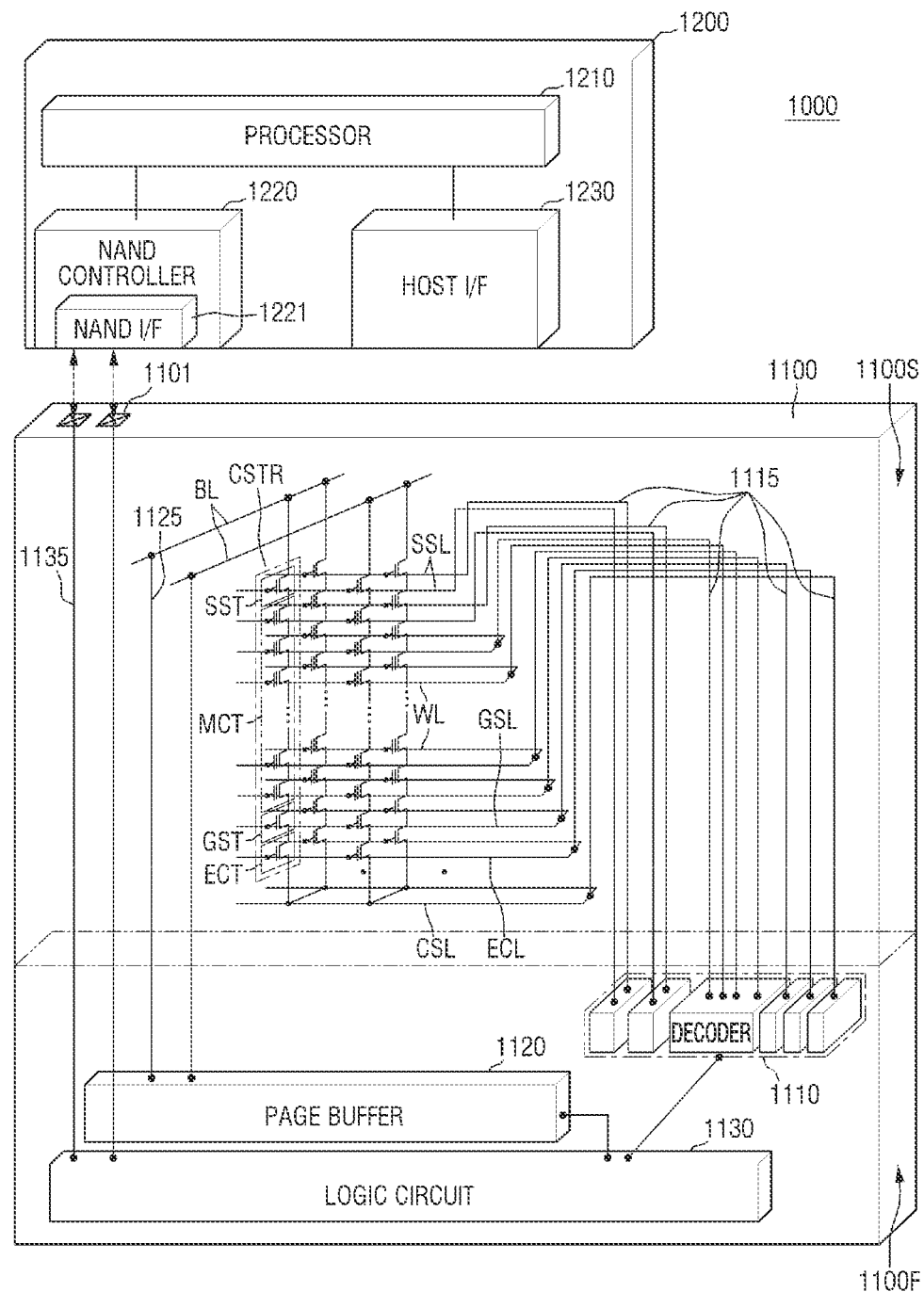
FIG. 23 is a schematic block diagram for explaining an electronic system according to some embodiments.
Figure 24:
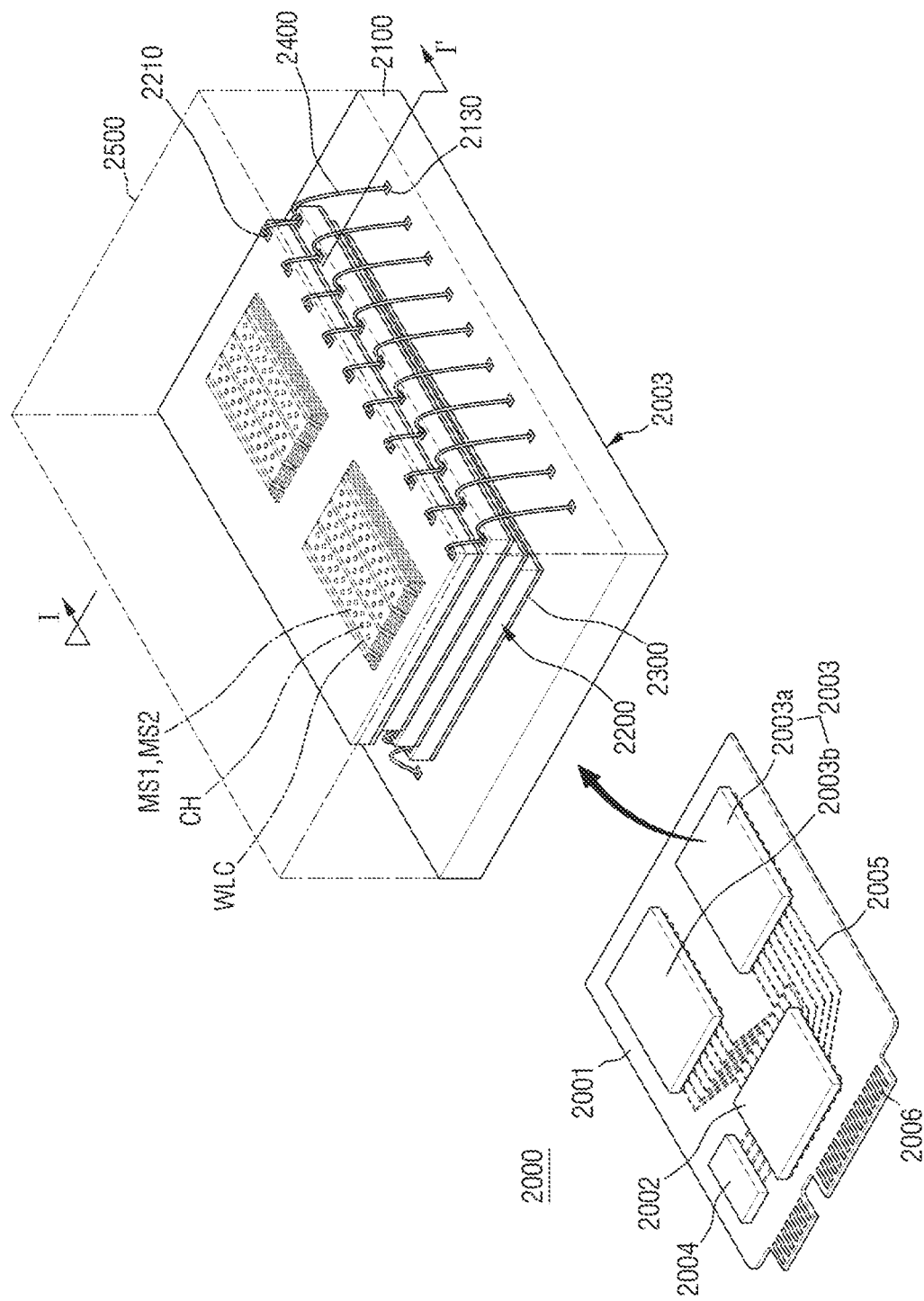
FIG. 24 is a schematic perspective view for explaining the electronic system according to some embodiments.
Figure 25:
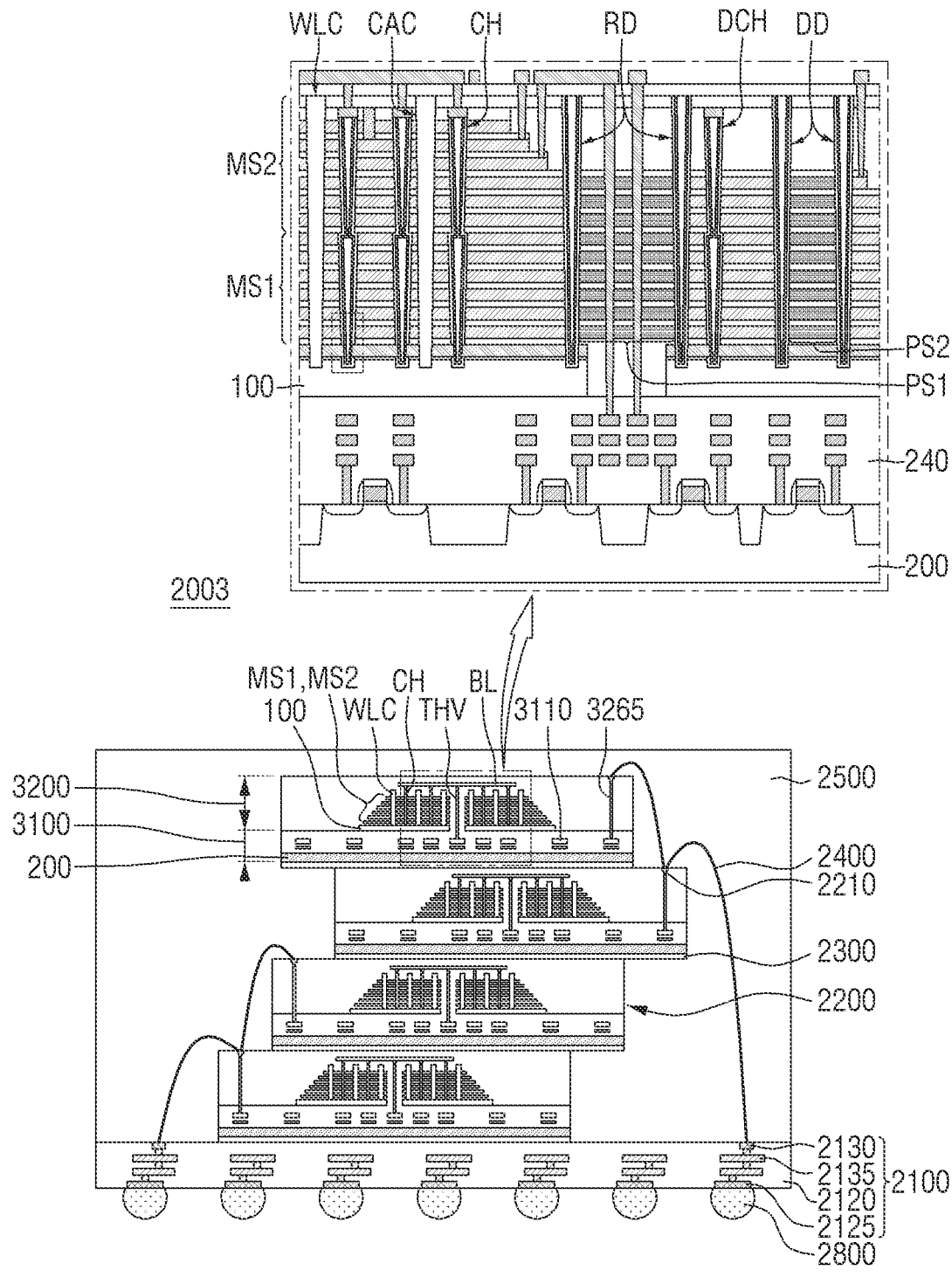
FIG. 25 is a schematic cross-sectional view taken along I-I' of FIG. 24.

FIG. 23 is a schematic block diagram for explaining an electronic system according to some embodiments. FIG. 24 is a schematic perspective view for explaining the electronic system according to some embodiments. FIG. 25 is a schematic cross-sectional view taken along I-I' of FIG. 24.

Referring to FIG. 23, an electronic system 1000 according to some embodiments may include a semiconductor memory device 1100 and a controller 1200 that is electrically connected to the semiconductor memory device 1100. The electronic system 1000 may be a storage device that includes one or a plurality of semiconductor memory devices 1100, or may be an electronic device that includes the storage device. For example, the electronic system 1000 may be an SSD device (solid state drive device) including one or a plurality of semiconductor memory devices 1100, a USB (Universal Serial Bus) device, a computing system, a medical device, and/or a communication device.

The semiconductor memory device 1100 may be a nonvolatile memory device (for example, a NAND flash memory device), and may be, for example, the semiconductor memory device described above with respect to FIGS. 1 to 12. The semiconductor memory device 1100 may include a first structure 1100F, and a second structure 1100S on the first structure 1100F.

The first structure 1100F may be a peripheral circuit structure that includes a decoder circuit 1110 (e.g., the row decoder 33 of FIG. 1), a page buffer 1120 (e.g., the page buffer 35 of FIG. 1), and a logic circuit 1130 (e.g., the control logic 37 of FIG. 1).

The second structure 1100S may include the common source line CSL, the plurality of bit lines BL, and the plurality of cell strings CSTR explained above using FIG. 2. The cell strings CSTR may be connected to the decoder circuit 1110 through at least one word line WL, at least one string selection line SSL, and at least one ground selection line GSL. Further, the cell strings CSTR may be connected to the page buffer 1120 through the bit lines BL.

The common source line CSL and the cell strings CSTR may be electrically connected to the decoder circuit 1110 through first connection wirings 1115 that extend from the first structure 1100F to the second structure 1100S. In some embodiments, the first connection wiring 1115 may correspond to the first through via THV explained above referring to FIGS. 1 to 12. That is, the first through via THV may electrically connect the respective gate electrodes ECL, GSL, WL, and SSL and the decoder circuit 1110 (for example, the row decoder 33 of FIG. 1).

In some embodiments, the bit lines BL may be electrically connected to the page buffer 1120 through second connection wirings 1125 that extend from the first structure 1100F to the second structure 1100S.

The semiconductor memory device 1100 may communicate with the controller 1200 through at least one I/O pad 1101 that is electrically connected to a logic circuit 1130 (for example, the control logic 37 of FIG. 1). The I/O pad 1101 may be electrically connected to the logic circuit 1130 through an I/O connection wiring 1135 that extends from the first structure 1100F to the second structure 1100S.

The controller 1200 may include a processor 1210, a NAND controller 1220, and a host interface 1230. In some embodiments, the electronic system 1000 may include a plurality of semiconductor memory devices 1100, and in this case, the controller 1200 may control the plurality of semiconductor memory devices 1100.

The processor 1210 may control the overall operation of the electronic system 1000 including the controller 1200. The processor 1210 may operate according to a predetermined firmware, and may control the NAND controller 1220 to access the semiconductor memory device 1100. The NAND controller 1220 may include a NAND interface 1221 that processes communication with the semiconductor memory device 1100. Control command for controlling the semiconductor memory device 1100, data to be recorded in the memory cell transistors MCT of the semiconductor memory device 1100, data to be read from the memory cell transistors MCT of the semiconductor memory device 1100, and the like may be transmitted through the NAND interface 1221. The host interface 1230 may provide a communication function between the electronic system 1000 and an external host. When receiving the control command from an external host through the host interface 1230, the processor 1210 may control the semiconductor memory device 1100 in response to the control command.

Referring to FIGS. 24 and 25, the electronic system according to some embodiments may include a main board 2001, a main controller 2002 mounted on the main board 2001, one or more semiconductor packages 2003, and a DRAM (dynamic random-access memory) 2004. The semiconductor package 2003 and the DRAM 2004 may be connected to the main controller 2002 by wiring patterns 2005 formed on the main board 2001.

The main board 2001 may include a connector 2006 including a plurality of pins coupled to an external host. In the connector 2006, the number and arrangement of the plurality of pins may vary depending on the communication interface between the electronic system 2000 and the external host. In some embodiments, the electronic system 2000 may communicate with an external host according to any one of interfaces such as M-Phy for USB, PCI-Express (Peripheral Component Interconnect Express), SATA (Serial Advanced Technology Attachment), and UFS (Universal Flash Storage). In some embodiments, the electronic system 2000 may be operated by power supplied from an external host through the connector 2006. The electronic system 2000 may further include a PMIC (Power Management Integrated Circuit) that distributes the power supplied from the external host to the main controller 2002 and the semiconductor package 2003.

The main controller 2002 may record data in the semiconductor package 2003 and/or read data from the semiconductor package 2003, and may improve the operating speed of the electronic system 2000.

The DRAM 2004 may be a buffer memory configured to alleviate a speed difference between the semiconductor package 2003, which is a data storage area, and an external host. The DRAM 2004 included in the electronic system 2000 may also operate as a kind of cache memory, and may also provide a space for temporarily storing data in the control operation of the semiconductor package 2003. When the DRAM 2004 is included in the electronic system 2000, the main controller 2002 may further include a DRAM controller for controlling the DRAM 2004, in addition to the NAND controller for controlling the semiconductor package 2003.

The semiconductor package 2003 may include a first semiconductor package 2003a and a second semiconductor package 2003b that are spaced apart from each other. The first semiconductor package 2003a and the second semiconductor package 2003b may each be a semiconductor package that includes a plurality of semiconductor chips 2200. The first semiconductor package 2003a and the second semiconductor package 2003b may each include a package substrate 2100, semiconductor chips 2200 on the package substrate 2100, adhesive layers 2300 placed on the lower surfaces of each of the semiconductor chips 2200, a connection structure 2400 that is configured to electrically connect the semiconductor chips 2200 and the package substrate 2100, and a molding layer 2500 that covers the semiconductor chips 2200 and the connection structure 2400 on the package substrate 2100.

The package substrate 2100 may be a printed circuit board that includes upper pads 2130. Each semiconductor chip 2200 may include an I/O pad 2210. The I/O pad 2210 may correspond to the I/O pad 1101 of FIG. 23.

Each of the semiconductor chips 2200 may include a first structure 3100, and a second structure 3200 stacked on the first structure 3100. Each of the semiconductor chips 2200 may include the semiconductor memory device explained above using FIGS. 1 to 12. As an example, the first structure 3100 may include the second substrate 200 and the fifth interlayer insulation film 240 explained above using FIGS. 3 and 4. In addition, and as an example, the second structure 3200 may include the first substrate 100, the mold structures MS1 and MS2, the channel structure CH, the bit line BL, the block separation region WLC, the cell gate cutting region CAC, the extension gate cutting region CNC, the first dam region RD, the second dam region DD, the first pad structure PS1, and the second pad structure PS2 explained above using FIGS. 3 and 4.

In some embodiments, the connection structure 2400 may be a bonding wire that electrically connects the I/O pad 2210 and the upper pads 2130. Therefore, in each of the first semiconductor package 2003a and the second semiconductor package 2003b, the semiconductor chips 2200 may be electrically connected to each other in a bonding wire manner, and may be electrically connected to the upper pads 2130 of the package substrate 2100. In some embodiments, in each of the first semiconductor package 2003a and the second semiconductor package 2003b, the semiconductor chips 2200 may also be electrically connected to each other by a connection structure including a through silicon via (TSV) or other connection structure instead of the bonding wire type connection structure 2400.

In some embodiments, the main controller 2002 and the semiconductor chips 2200 may also be included in a single package. In some embodiments, the main controller 2002 and the semiconductor chips 2200 may be mounted on a separate interposer board different from the main board 2001, and the main controller 2002 and the semiconductor chips 2200 may also be connected to each other by the wiring formed on the interposer board.

In some embodiments, the package substrate 2100 may be a printed circuit board. The package substrate 2100 may include a package substrate body portion 2120, upper pads 2130 placed on an upper surface of the package substrate body portion 2120, lower pads 2125 placed on a lower surface of the package substrate body portion 2120 or exposed through the lower surface, and inner wirings 2135 that electrically connect the upper pads 2130 and the lower pads 2125 inside the package substrate body portion 2120. The upper pads 2130 may be electrically connected to the connection structures 2400. The lower pads 2125 may be connected to the wiring patterns 2005 of the main board 2010 of the electronic system 2000 through the conductive connections 2800, as seen in FIG. 24.

In concluding the detailed description, those skilled in the art will appreciate that many variations and modifications may be made to the preferred embodiments without substantially departing from the principles of the present inventive concept. Therefore, the disclosed exemplary embodiments of the disclosure are used in a generic and descriptive sense only and not for purposes of limitation.

What is claimed is:

1. A semiconductor memory device comprising:
a mold structure that includes mold insulation films and gate electrodes alternately stacked on a first substrate;
a channel structure that penetrates the mold structure and intersects the gate electrodes;
a block separation region that extends in a first direction parallel to an upper surface of the first substrate and that cuts the mold structure;
a first dam region that has a closed loop in a plane parallel to the upper surface of the first substrate and that cuts the mold structure;
a second dam region that is spaced apart from the first dam region in the first direction, that has a closed loop in the plane parallel to the upper surface of the first substrate, and that cuts the mold structure;
pad insulation films in the first dam region and the second dam region, the pad insulation films alternately stacked with the mold insulation films and that include a material different from the mold insulation films; and
a through via in the first dam region that penetrates through the first substrate, the mold insulation films, and the pad insulation films,
wherein the second dam region has no through via.

2. The semiconductor memory device of claim 1, wherein at least one gate electrode of the gate electrodes and at least one pad insulation film of the pad insulation films are an equal distance from the upper surface of the first substrate.

3. The semiconductor memory device of claim 1, further comprising an interlayer insulation film that covers the mold structure on the first substrate.

4. The semiconductor memory device of claim 1, wherein a first length of the first dam region in the first direction is greater than a second length of the second dam region in the first direction.

5. The semiconductor memory device of claim 4, wherein the second length of the second dam region is 0.1 to 0.9 times the first length.

6. The semiconductor memory device of claim 4, wherein the first length of the first dam region is 2 μm to 5 μm.

7. The semiconductor memory device of claim 1, wherein each mold insulation film includes a silicon oxide film, and wherein each pad insulation film includes a silicon nitride film.

8. The semiconductor memory device of claim 1, wherein the first dam region and the second dam region each include a material different from the pad insulation films.

9. The semiconductor memory device of claim 8, wherein each pad insulation film of the pad insulation films includes a silicon nitride film, and the first dam region and the second dam region each include a silicon oxide film.

10. The semiconductor memory device of claim 1, further comprising:
a second substrate including an upper surface that faces a lower surface of the first substrate; and
a peripheral circuit element on the upper surface of the second substrate,
wherein the through via is connected to the peripheral circuit element.

11. The semiconductor memory device of claim 10, wherein the through via connects a gate electrode of the gate electrodes with the peripheral circuit element.

12. The semiconductor memory device of claim 1, further comprising:
a bit line that extends on the mold structure in a second direction that is parallel to the upper surface of the first substrate and that intersects the first direction, wherein the bit line is connected to the channel structure.

13. A semiconductor memory device comprising:
a first substrate that includes a cell array region and an extension region arranged in a first direction;
a mold structure including mold insulation films and gate electrodes alternately stacked on an upper surface of the first substrate;
a channel structure in the cell array region that penetrates through the mold structure and intersects the gate electrodes;
a first dam region in the extension region that has a closed loop in a plane parallel to the upper surface of the first substrate and that cuts the mold structure;
a second dam region in the extension region that is spaced apart from the first dam region in the first direction, that has a closed loop in the plane parallel to the upper surface of the first substrate, and that cuts the mold structure;
pad insulation films in the first dam region and the second dam region that are alternately stacked with the mold insulation films and that include a material different from the mold insulation films;
a second substrate including an upper surface that faces a lower surface of the first substrate;
a peripheral circuit element on the upper surface of the second substrate; and
a first through via in the first dam region that penetrates through the first substrate, the mold insulation films, and the pad insulation films, and connects a gate electrode of the gate electrodes with the peripheral circuit element, wherein a first length of the first dam region comprising a distance between opposite sides of the first dam region in the first direction is greater than a second length of the second dam region comprising a distance between opposite sides of the second dam region in the first direction.

14. The semiconductor memory device of claim 13, wherein the second dam region is free of a through via.

15. The semiconductor memory device of claim 13, further comprising a source structure interposed between the first substrate and the mold structure,
wherein the channel structure includes a semiconductor pattern and an information storage film between the semiconductor pattern and the gate electrodes, and
wherein the source structure penetrates through the information storage film and is in contact with the semiconductor pattern.

16. The semiconductor memory device of claim 13, wherein the first dam region and the second dam region each include a sequentially stacked silicon oxide film, a silicon nitride film, and a polysilicon film.

17. The semiconductor memory device of claim 13, further comprising:
an interlayer insulation film on the upper surface of the second substrate that covers the peripheral circuit element; and
a wiring structure in the interlayer insulation film that connects the peripheral circuit element and the first through via.

18. The semiconductor memory device of claim 13, further comprising:
a second through via in the second dam region that penetrates the mold insulation films and the pad insulation films,
wherein the second through via is disconnected from the peripheral circuit element.

19. A semiconductor memory device comprising:
a first substrate;
a mold structure that includes a plurality of alternately stacked mold insulation films and gate electrodes;
a channel structure that penetrates the mold structure and that intersects the gate electrodes;
first and second block separation regions that extend in a first direction parallel to an upper surface of the first substrate and that cut the mold structure;
first and second dam regions between the first and second block separation regions and spaced apart from each other, the first and second dam regions each cutting the mold structure and having a first closed loop and a second closed loop, respectively, when viewed in a plan view;
pad insulation films in the first dam region and the second dam region, the pad insulation films alternately stacked with the mold insulation films and including a material different from the mold insulation films; and
a through via in the first dam region that penetrates through the first substrate, the mold insulation films, and the pad insulation films,
wherein the second dam region has a smaller perimeter in the plan view than the first dam region.

* * * * *